(12) United States Patent
Lee et al.

(10) Patent No.: US 12,490,424 B2
(45) Date of Patent: Dec. 2, 2025

(54) SEMICONDUCTOR DEVICE

(71) Applicant: Samsung Electronics Co., Ltd., Suwon-si (KR)

(72) Inventors: Yanghee Lee, Incheon (KR); Jonghyuk Park, Hwaseong-si (KR); Ilyoung Yoon, Hwaseong-si (KR); Boun Yoon, Seoul (KR); Jeehwan Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 339 days.

(21) Appl. No.: 17/713,327

(22) Filed: Apr. 5, 2022

(65) Prior Publication Data

US 2023/0005935 A1    Jan. 5, 2023

(30) Foreign Application Priority Data

Jul. 2, 2021    (KR) .......................... 10-2021-0087098

(51) Int. Cl.
*H10B 12/00*    (2023.01)

(52) U.S. Cl.
CPC ............. *H10B 12/50* (2023.02); *H10B 12/09* (2023.02); *H10B 12/315* (2023.02); *H10B 12/34* (2023.02); *H10B 12/482* (2023.02)

(58) Field of Classification Search
CPC ...... H10B 12/50; H10B 12/09; H10B 12/315; H10B 12/34; H10B 12/482; H10B 12/0335; H01L 23/544
See application file for complete search history.

(56) References Cited

U.S. PATENT DOCUMENTS

| | | | |
|---|---|---|---|
| 6,335,287 B1 | 1/2002 | Hwang et al. | |
| 8,673,788 B2 | 3/2014 | Cheng et al. | |
| 2010/0283091 A1* | 11/2010 | Park ..................... | H10B 12/482 |
| | | | 257/E21.585 |
| 2016/0027785 A1* | 1/2016 | Fujimoto ............... | H10B 12/34 |
| | | | 257/330 |
| 2020/0027842 A1* | 1/2020 | Lee ........................ | H01L 29/785 |
| 2020/0203215 A1* | 6/2020 | Jang .................. | H01L 21/76229 |

(Continued)

FOREIGN PATENT DOCUMENTS

| | | |
|---|---|---|
| KR | 19990000343 A | 1/1999 |
| KR | 20050035361 A | 4/2005 |
| KR | 20080074486 A | 8/2008 |

*Primary Examiner* — Kretelia Graham
*Assistant Examiner* — Jaesun Lee
(74) *Attorney, Agent, or Firm* — Harness, Dickey & Pierce P.L.C.

(57) ABSTRACT

A semiconductor device may include a substrate, a patterned structure, a filling pattern, and a conductive spacer. The substrate may include a semiconductor chip region and an overlay region. The patterned structure may include bit line structures spaced by a first distance on the semiconductor region, define a first trench and a second trench on first and second regions of the overlay region, and include key structures on the second region and spaced apart by the second trench. The filling pattern may fill lower portions of the first and second trenches on the first and second regions. The first region may be an edge portion of the overlay region. The second region may be a central portion of the overlay region. The conductive spacer may contact an upper surface of the filling pattern and may be on an upper sidewall of each of the first and second trenches.

19 Claims, 35 Drawing Sheets

(56) References Cited

U.S. PATENT DOCUMENTS

| | | |
|---|---|---|
| 2020/0227315 A1 | 7/2020 | Park et al. |
| 2021/0082809 A1* | 3/2021 | Kim ...................... H01L 23/544 |
| 2021/0134806 A1* | 5/2021 | Lee ........................ H10B 12/37 |
| 2023/0005935 A1* | 1/2023 | Lee ........................ H10B 12/50 |

* cited by examiner

FIG. 9
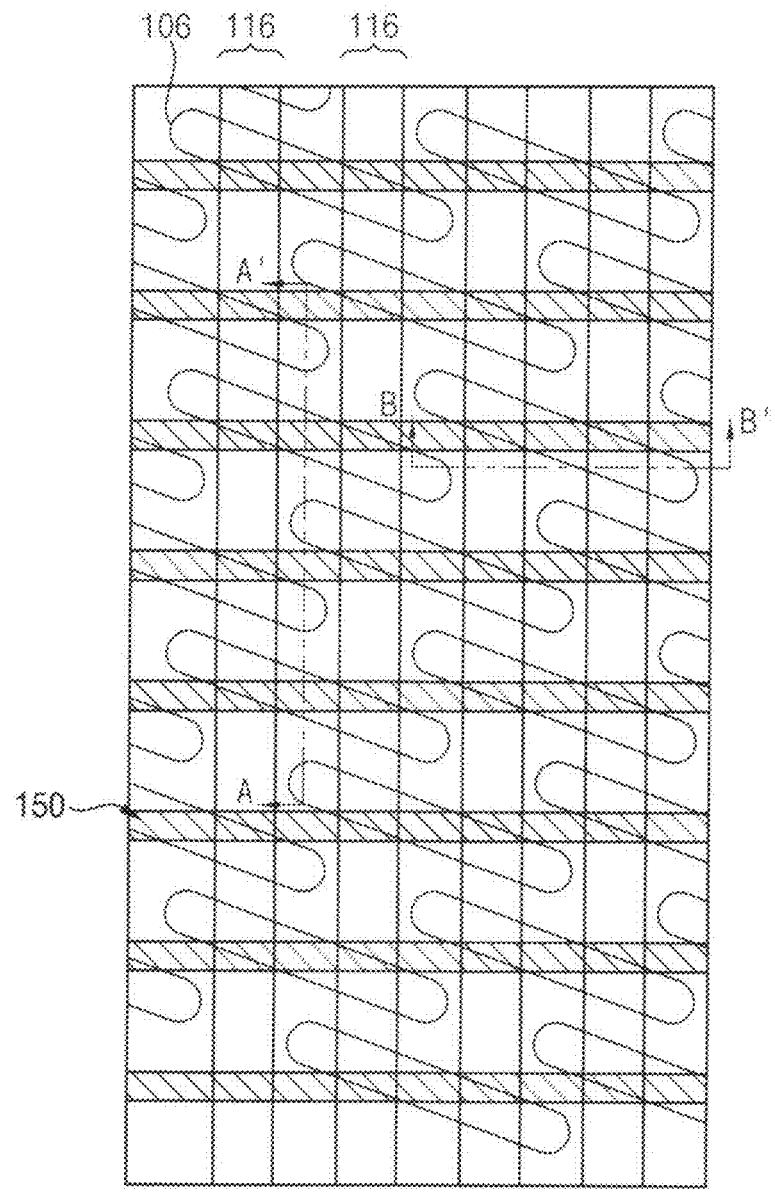
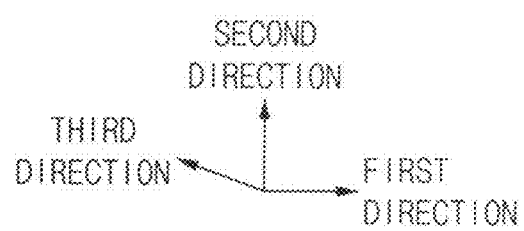

SEMICONDUCTOR DEVICE

CROSS-REFERENCE TO RELATED APPLICATION

This application claims priority under 35 USC § 119 to Korean Patent Application No. 10-2021-0087098, filed on Jul. 2, 2021 in the Korean Intellectual Property Office (KIPO), the contents of which are incorporated by reference herein in their entirety.

BACKGROUND

1. Field

Example embodiments relate to a semiconductor device and more particularly, example embodiments relate to a DRAM (dynamic random access memory) device.

2. Description of the Related Art

In a DRAM device, structures in a chip region may be formed using an overlay key in a scribe lane region. The overlay key may consist of key structures and a trench formed therebetween. However, a substrate may be excessively removed at a bottom of a trench of the overlay key. In this case, the overlay key may be abnormally formed, and thus damage to pattern structures may occur during a subsequent process.

SUMMARY

Example embodiments provide a semiconductor device having overlay keys.

According to an example embodiment, a semiconductor device may include a substrate including a semiconductor chip region and an overlay region, a patterned structure on the substrate, a filling pattern, and a conductive spacer contacting an upper surface of the filling pattern. The substrate may include a first region at an edge portion of the overlay region and a second region at a central portion of the overlay region. The patterned structure may include bit line structures on the semiconductor chip region of the substrate. The bit line structures may be spaced apart from each other by a first distance. The patterned structure may define a first trench on the first region and a second trench on the second region. The patterned structure may include key structures on the second region and spaced apart from each other by the second trench. The filling pattern may be on the first region and the second region. The filling pattern may fill a lower portion of the first trench on the first region and a lower portion of the second trench on the second region The conductive spacer maybe on an upper sidewall of the first trench and an upper sidewall of the second trench.

According to an example embodiment, a semiconductor device may include a substrate including a semiconductor chip region and an overlay region, a gate structure buried in an upper portion of the semiconductor chip region of the substrate, a patterned structure on the substrate, a storage node contact on the substrate, a capacitor on the storage node contact, a filling pattern, and a conductive spacer contacting an upper surface of the filling pattern. The substrate may include a first region at an edge portion of the overlay region and a second region at a central portion of the overlay region. The first region may include a first active pattern. The patterned structure may include bit line structures on the semiconductor chip region of the substrate. The bit line structures may be spaced apart from each other by a first distance. The patterned structure may define a first trench on the first region and a second trench on the second region. The first trench may expose the first active pattern on the first region of the substrate. The patterned structure may include key structures on the second region. The key structures may be spaced apart from each other by the second trench. The conductive spacer may be on an upper sidewall of each of the first trench and the second trench. The storage node contact may be on the substrate between the bit line structures. The filling pattern may fill a lower portion of each of the first trench and the second trench.

According to an example embodiment, a semiconductor device may include a substrate including an overlay region, a patterned structure on the substrate, a filling pattern, and a conductive spacer contacting an upper surface of the filling pattern. The substrate may include a first region at an edge region of the overlay region and a second region at a center region of the overlay region. The first region may include a first active pattern. The patterned structure may define a first trench on the first region and a second trench on the second region. The first trench may expose the first active pattern. The patterned structure may include key structures on the second region. The key structures may be spaced apart from each other by the second trench. The filling pattern may fill a lower portion of each of the first trench and the second trench. The conductive spacer may be on an upper sidewall of each of the first trench and the second trench.

According to example embodiments, a method of manufacturing a semiconductor device is provided, which may limit and/or prevent the overlay key from not being normally formed due to excessively etching of the substrate at the bottom of trenches used as the overlay key. Thus, the semiconductor device may have improved electrical characteristics.

BRIEF DESCRIPTION OF THE DRAWINGS

Example embodiments will be more clearly understood from the following detailed description taken in conjunction with the accompanying drawings. FIGS. 1 to 35 represent non-limiting, example embodiments as described herein.

FIGS. 1 to 33 are cross-sectional views and plan views illustrating a method of manufacturing a semiconductor device in accordance with some example embodiments; and FIGS. 34 and 35 are a plan view and a cross-sectional view of semiconductor devices device in accordance with some example embodiments.

DESCRIPTION OF EMBODIMENTS

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIGS. 1 to 33 are cross-sectional views and plan views illustrating a method of manufacturing a semiconductor device in accordance with some example embodiments.

Particularly, FIGS. 1 to 4, 9, 18, 27 and 31 are plan views, and FIGS. 5 to 8, 10 to 17, 19 to 26, and 28 to 33 are cross-sectional views.

Figure 2:
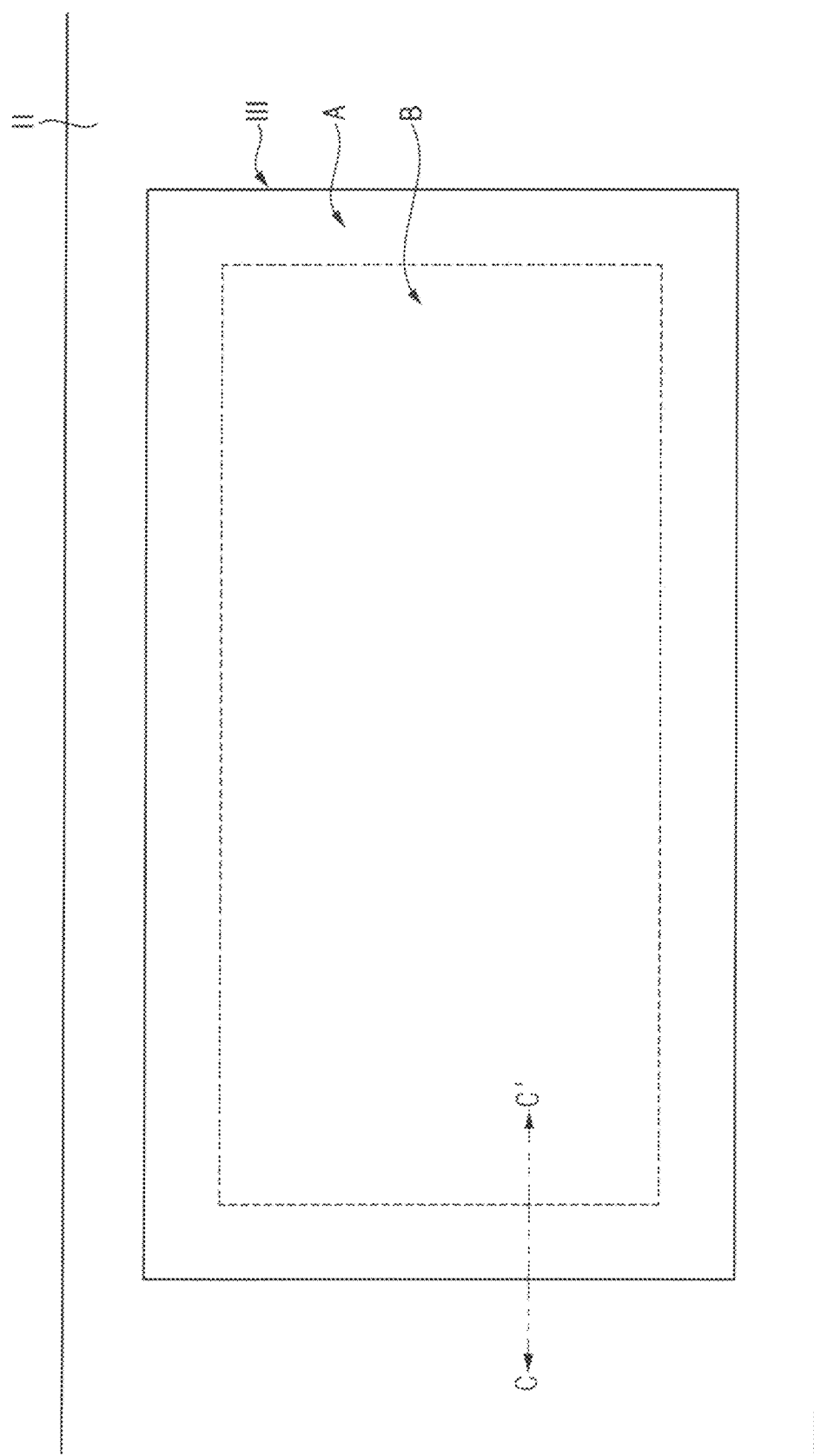
Figure 3:
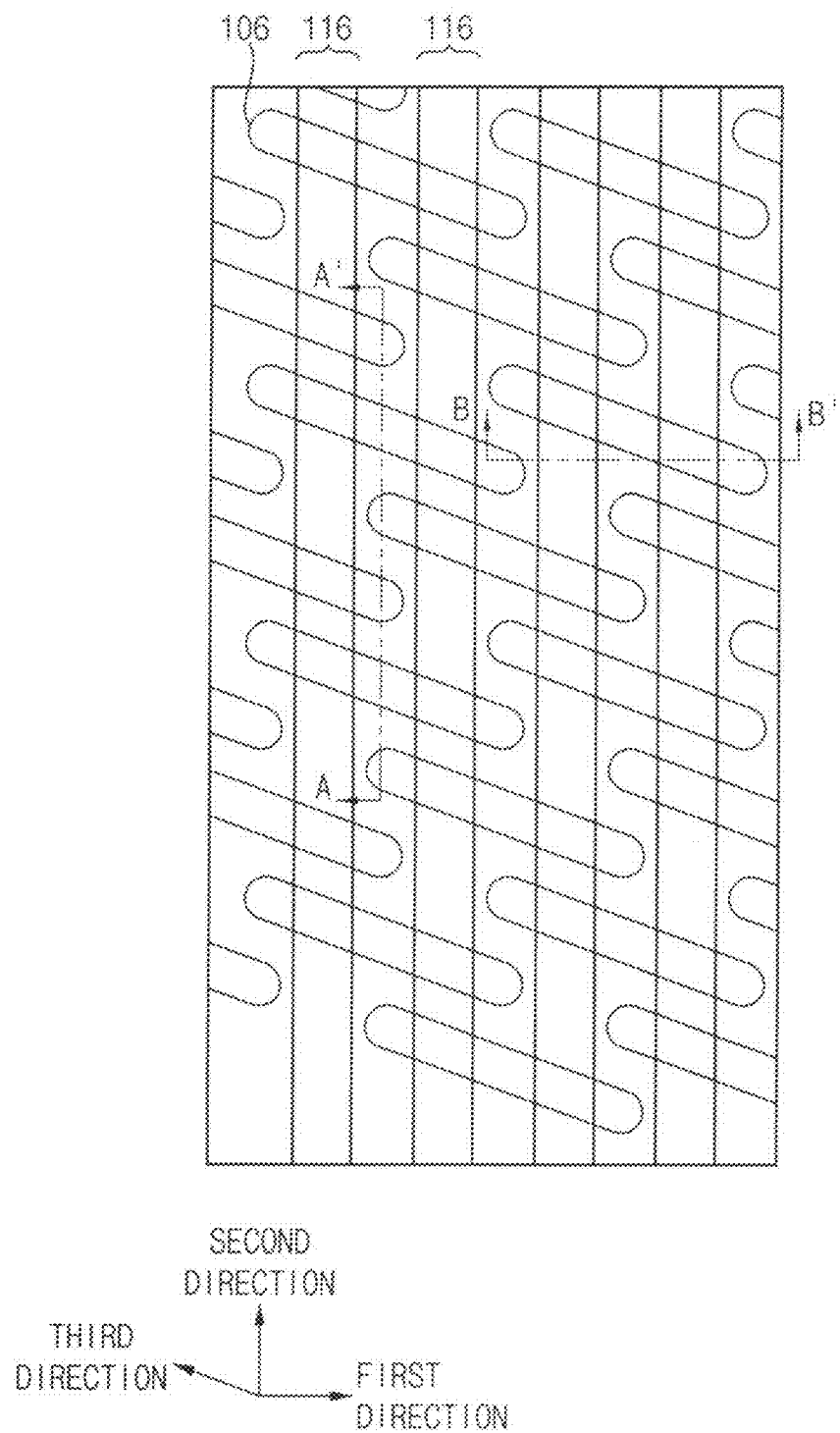
Figure 4:
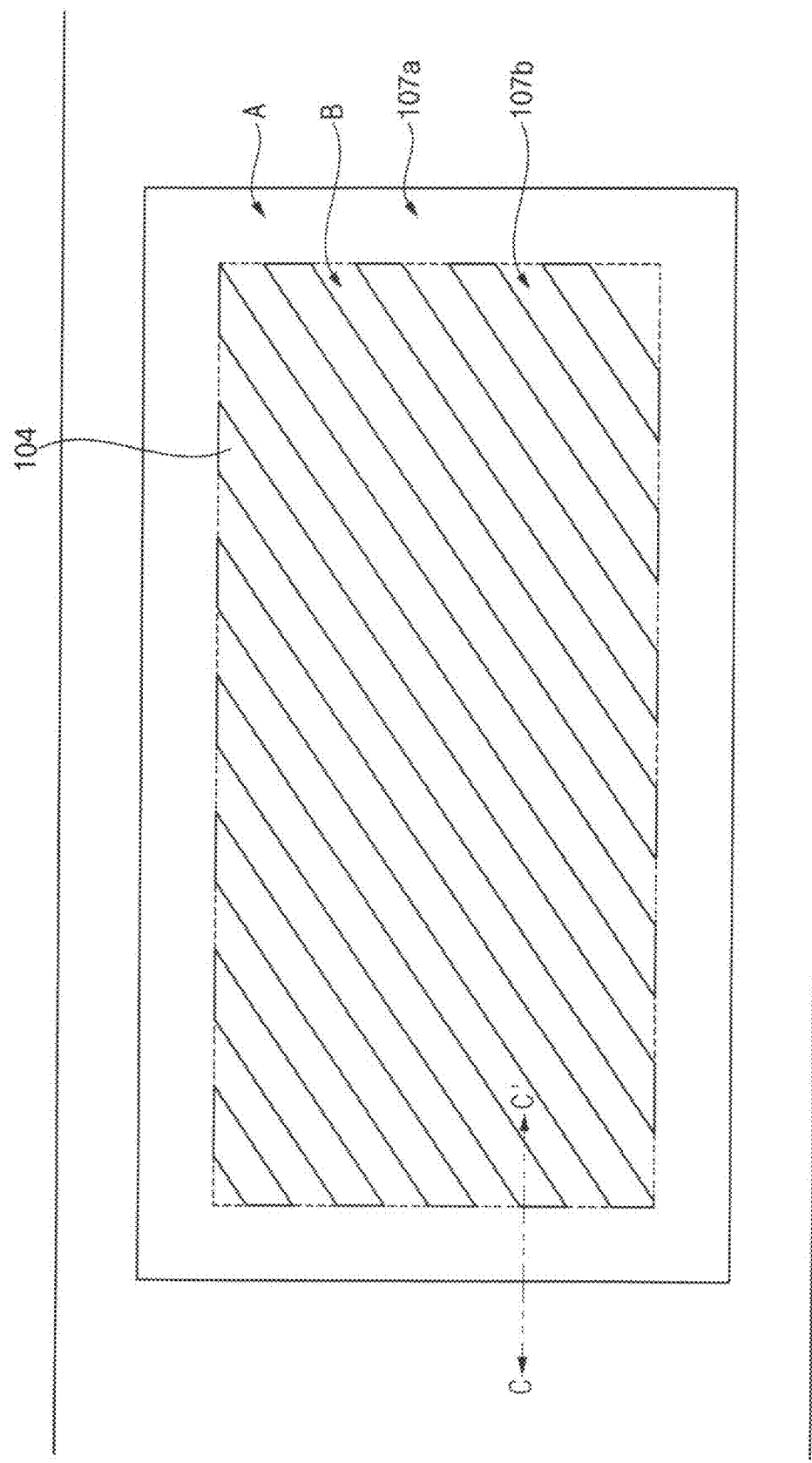
Figure 5:
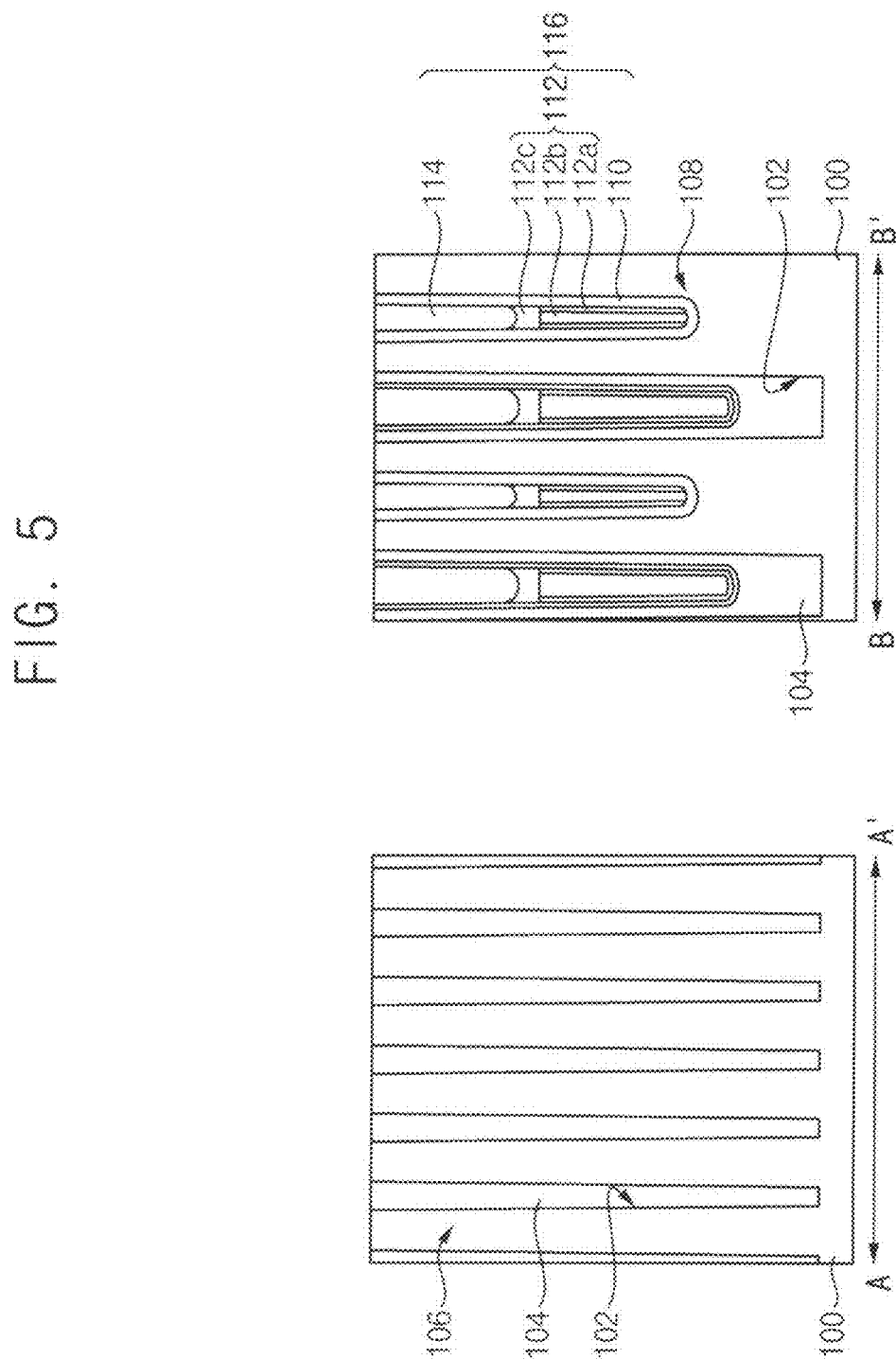
Figure 6:
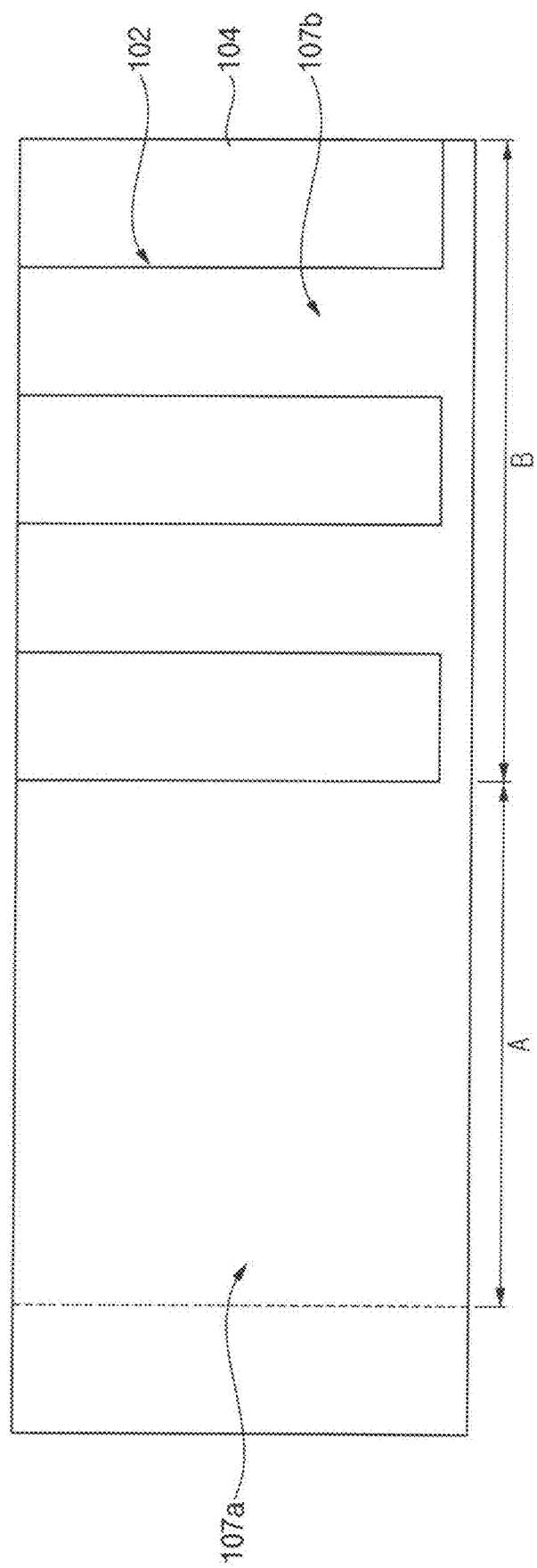

FIGS. 5, 7, 10, 12, 14, 16, 19, 21, 23, 25, 28, 30 and 32 include cross-sections taken along lines A-A' and B-B' of FIG. 3. FIGS. 2, 4, 18 and 27 are plan views showing an overlay region. FIGS. 6, 8, 11, 13, 17, 20, 24, 26, 29, 31 and 33 include a cross-section taken along line C-C' of FIG. 3.

Hereinafter, an extension direction of a bit line structure is referred to as a first direction, and a direction perpendicular to the first direction (e.g., an extension direction of a gate structure) is referred to as a second direction.

Figure 1:
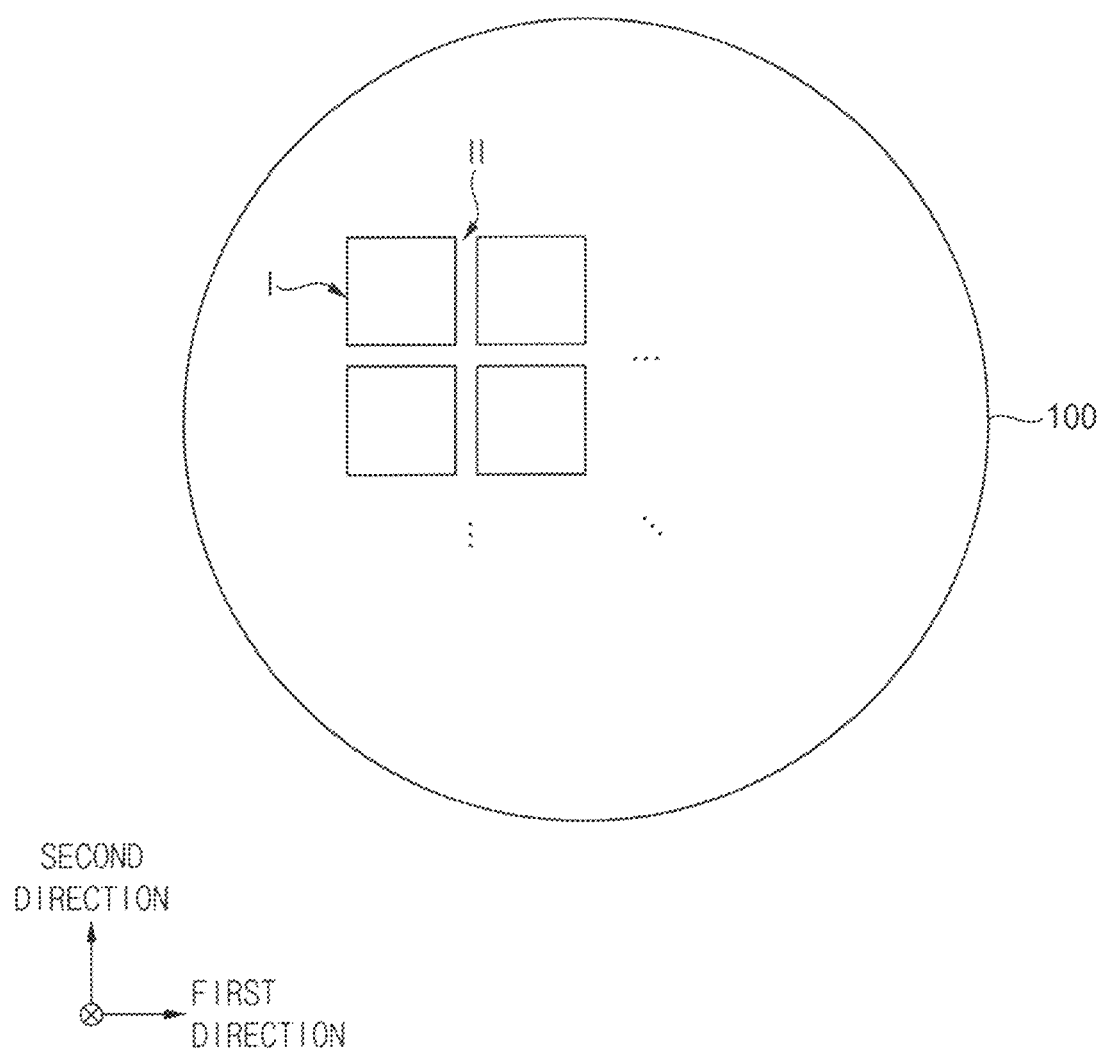

Referring to FIGS. 1 and 2, a substrate 100 may include semiconductor chip regions I in which a semiconductor chip is formed and a scribe lane region II between the semiconductor chip regions I.

The substrate 100 may be a wafer including silicon, germanium, silicon-germanium, or a III-V compound, such as GaP, GaAs, or GaSb. In some example embodiments, the substrate 100 may be a silicon-on-insulator (SOI) wafer or a germanium-on-insulator (GOI) wafer.

In some example embodiments, the semiconductor chip regions I may be spaced apart from each other in each of the first and second directions.

The scribe lane region II of the substrate 100 may be provided to cut semiconductor chip patterns into individual semiconductor chips. In the scribe lane region II, a TEG (Test Element Group) for testing electrical characteristics and failure of elements included in the semiconductor chip, an alignment key or overlay key for aligning in a photo process. The alignment key may be used for aligning an exposure mask at a correct position over the substrate 100 in the photo process, and the overlay key may be used for detecting overlay status between a material pattern on the substrate 100 and a photoresist pattern thereon to correct the overlay and misalignment of the photoresist pattern.

Hereinafter, a region in which an overlay key is formed in the scribe lane region II is referred to as an overlay region III. The overlay region III may include a second region B, in which key structures used as actual overlay keys are formed, and a first region A surrounding the second region B. The first region A may correspond to an edge region of the overlay region III, and the second region B may correspond to a central region of the overlay region III. That is, the first region A may be an area to inside the overlay region III by a first width from an end of the overlay region III. In a plan view, the first region A may have a rectangular ring shape. In some example embodiments, the first width may be in a range of about 1 μm to about 10 μm. For example, the first width may be in a range of about 1 μm to about 4 μm.

Referring to FIGS. 3 to 6, a first active pattern 106 may be formed on the semiconductor chip region I, and a second active pattern 107a may be formed on the first region A of the overlay region III. A third active pattern 107b may be formed on the second region B of the overlay region III.

The first to third active patterns 106, 107a, and 107b may be formed by removing an upper portion of the substrate 100 to form a first trench 102. An isolation pattern 104 may be formed in the first trench 102. The isolation pattern 104 may be formed by forming an isolation layer on the substrate 100 to fill the first trench 102 and planarizing the isolation layer until upper surfaces of the first to third active patterns 106, 107a, and 107b may be exposed. In some example embodiments, the planarization process may include a chemical mechanical polishing (CMP) process and/or an etch back process.

A plurality of first active patterns 106 may be formed to be spaced apart from each other in the first and second directions. The first active patterns 106 may extend in a third direction having an inclination with respect to the first direction.

The second active pattern 107a may be formed on an entire of the first region A. That is, the isolation pattern 104 may not be formed on the first region A of the substrate 100.

If the isolation pattern 104 is formed on the first region A of the substrate 100, a first trench having a wide width may be formed in the first region A. Therefore, in the process of planarizing the isolation layer in the first trench, a dishing defect in which an upper portion of the isolation layer is deeply indented may occur. When the upper portion of the isolation layer is deeply indented, the upper portions of the isolation pattern and active patterns of the semiconductor chip region I and the overlay region III adjacent to the first region A are excessively polished. Thus, a surface height of the upper portions of the isolation pattern and active patterns may be lowered. However, the isolation pattern may not be formed on the first region A of the substrate 100, and the second active pattern 107a may be formed the entire of the first region A of the substrate 100. Thus, dishing defects may decrease in the process for forming the isolation pattern.

The third active pattern 107b may have a line shape. Plurality of the third active patterns 107b may be formed to be spaced apart from each other. The third active pattern 107b and the isolation pattern 104 may be alternately and repeatedly disposed in the second region B.

In some example embodiments, the third active pattern 107b may have a line shape extending in a fourth direction inclined with respect to the first direction. In some example embodiments, although not shown, the third active pattern 107b may have a line shape extending in the first direction or a line shape extending in the second direction.

The third active pattern 107b and the first trench 102 formed in the second region B may serve as a first overlay key. That is, the third active pattern 107b may serve as a key structure of the first overlay key, and the first trench 102 may serve as a trench of the first overlay key. The first overlay key may be used as an overlay key in a subsequent patterning process of bit line structures.

A width of the second active pattern 107a in the first region A may be greater than each of a width of the third active pattern 107b in the second region B and a width of the first trench 102. A width described below may be a minimum width of a pattern or a trench.

In addition, the width of the third active pattern 107b and the width of the first trench 102 in the second region B may be greater than a width of the first active pattern 106 and a width of the trench 102 in the semiconductor chip region I, respectively.

After an impurity region formed in the substrate 100 by performing, e.g., an ion implantation process, the first active pattern 106 and the isolation pattern 104 in the semiconductor chip region I may be partially etched to form a first recess 108 extending in the second direction. A gate structure 116 may be formed in the first recess 108.

The gate structure 116 may include a first gate insulation layer 110 conformally on a surface of the first recess 108, a first gate electrode 112 on the first gate insulation layer 110 to fill a lower portion of the first recess 108, and a first capping pattern 114 on the first gate electrode 112 to fill an upper portion of the first recess 108. In some example embodiments, the first gate electrode 112 may include a barrier metal pattern 112*a*, a metal pattern 112*b*, and a polysilicon pattern 112*c*.

Figure 7:
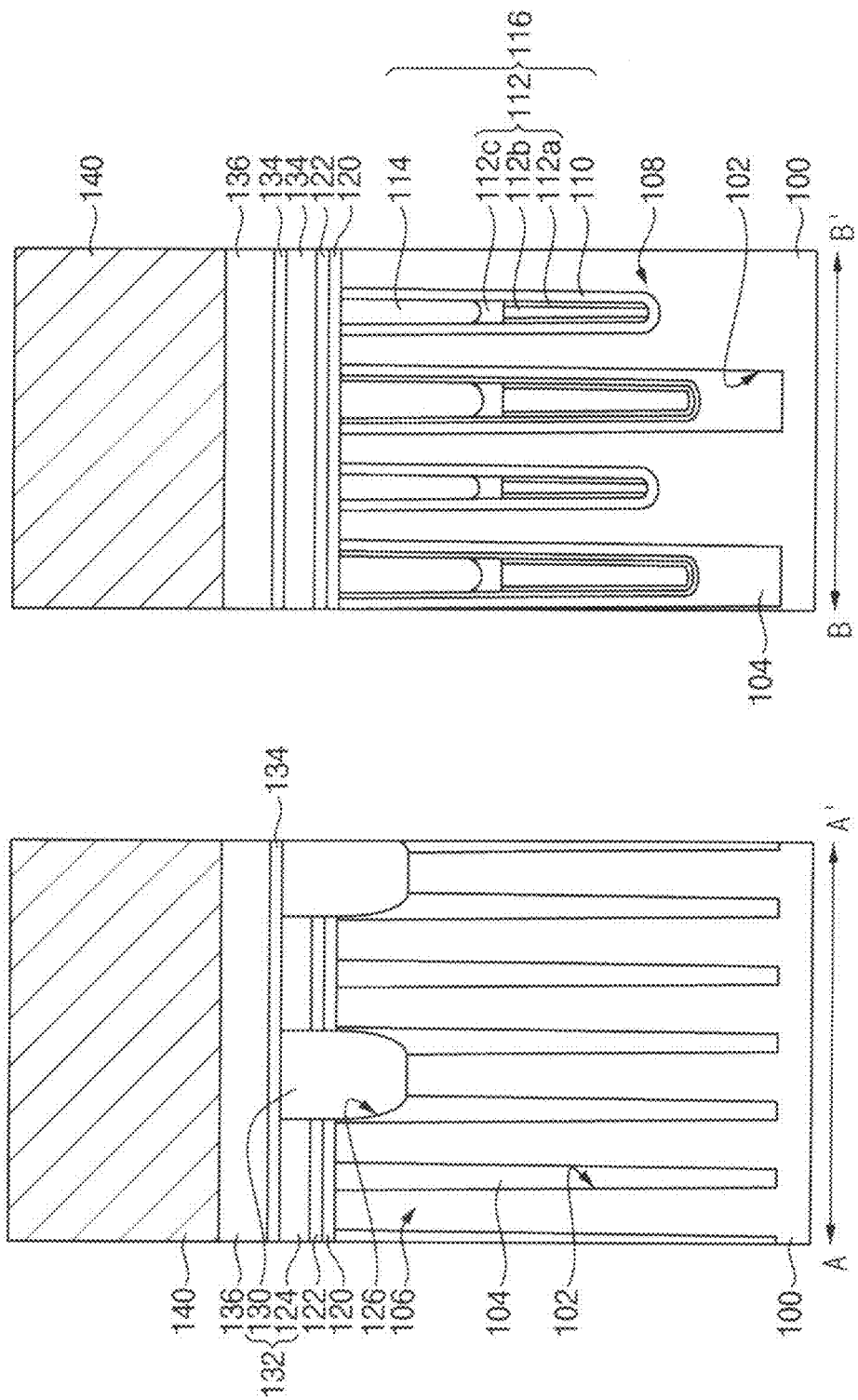
Figure 8:
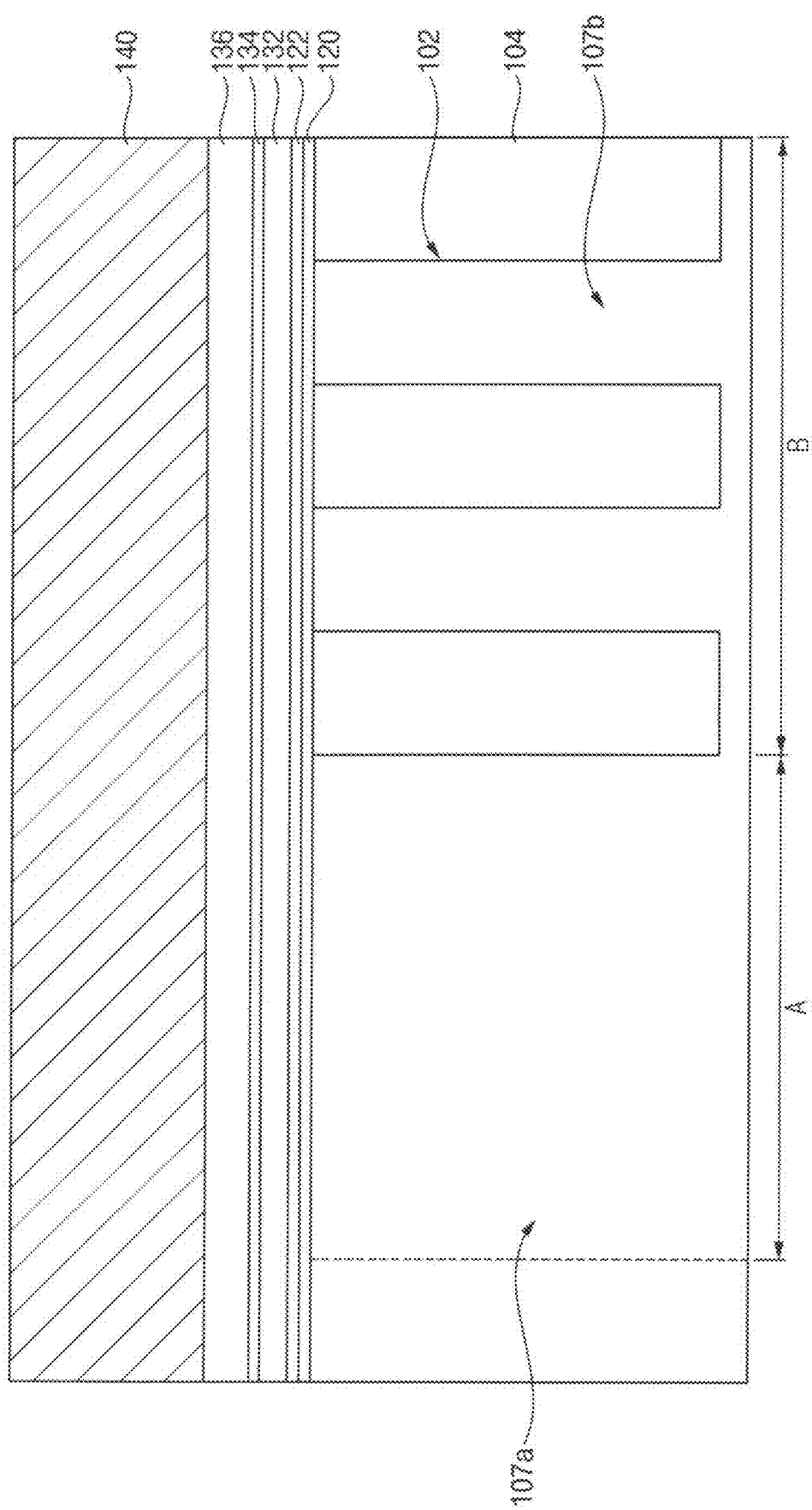

Referring to FIGS. 7 and 8, first and second insulation layers 120 and 122 may be sequentially formed on the first, second and third active patterns 106, 107*a* and 107*b* of the substrate and the isolation pattern 104. The first and second insulation layers 120 and 122 may include insulation materials having an etch selectivity to each other. For example, the first insulation layer 120 may include silicon oxide, and the second insulation layer 122 may include silicon nitride.

A first conductive layer 124 may be formed on the second insulation layer 122, and portions of the first conductive layer 124 and the first and second insulation layers 120 and 122 may be etched to form a first opening 126 exposing the first active pattern 106 formed on the semiconductor chip region I of the substrate 100. A second conductive pattern 130 may be formed in the first opening 126.

The first conductive layer 124 may include, e.g., polysilicon doped with impurities. The second conductive pattern 130 may include substantially the same material as the first conductive layer 124, and may include, e.g., polysilicon doped with impurities. The first conductive layer 124 and the second conductive pattern 130 may be merged to serve as a single lower conductive layer 132.

A barrier layer 134 and a first metal layer 136 may be sequentially formed on the lower conductive layer 132. In some example embodiments, the first metal layer 136 may include, e.g., tungsten.

A second capping layer 140 may be formed on the first metal layer 136. In some example embodiments, the second capping layer 140 may include silicon nitride.

Figure 10:
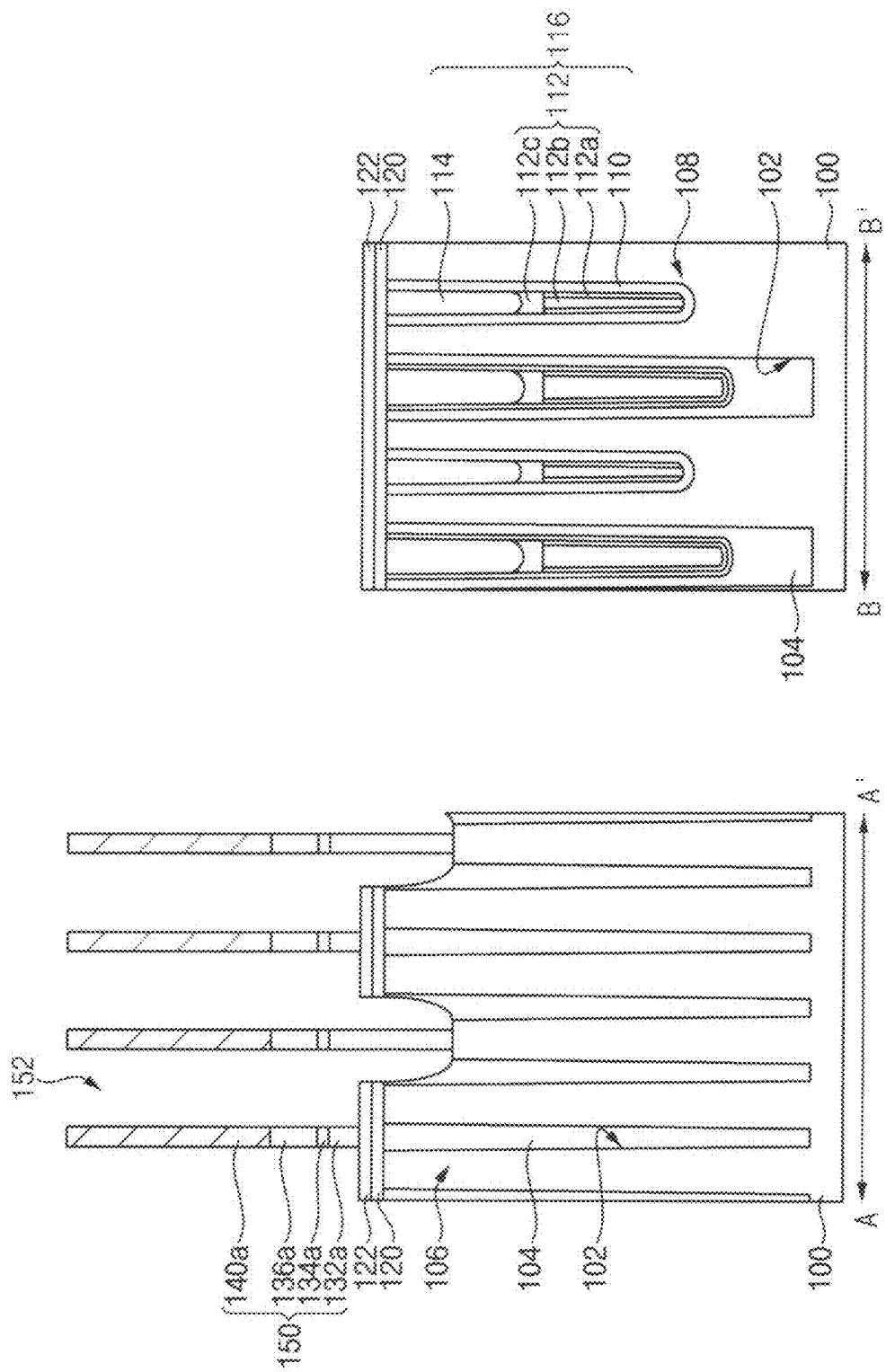
Figure 11:
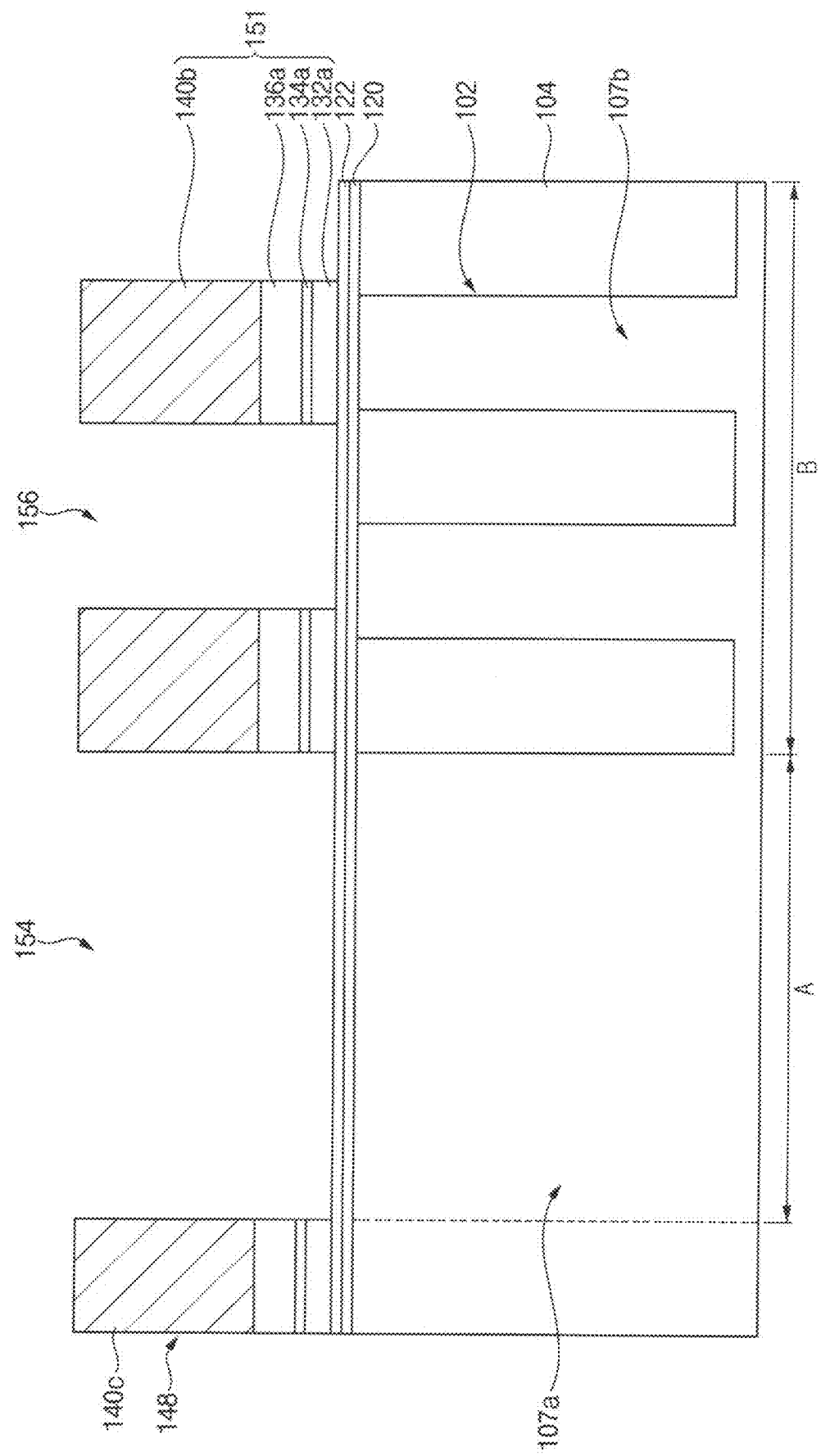

Referring to FIGS. 9 to 11, the second capping layer 140 may be patterned to form capping patterns. In this case, a second capping pattern 140*a* may be formed in the semiconductor chip region I, and third and fourth capping patterns 140*b* and 140*c* may be formed in the scribe lane region II. The third capping pattern 140*b* may be formed in the overlay region III, and the fourth capping pattern 140*c* may be formed outside a boundary of the overlay region III.

The second capping pattern 140*a* may be an etch mask for forming a bit line structure. The second capping pattern 140*a* may extend in the first direction, and a plurality of second capping patterns 140*a* may be spaced apart from each other in the second direction.

The third capping pattern 140*b* may be an etch mask for forming a key structure of the second overlay key. In some example embodiments, the third capping pattern 140*b* may extend in the first direction, and a plurality of third capping patterns 140*b* may be spaced apart from each other in the second direction.

The fourth capping pattern 140*c* may be an etch mask for forming an outer structure 148 defining an outermost trench of the second overlay key.

The first metal layer 136, the barrier layer 134, and the lower conductive layer 132 may be sequentially etched using the second capping pattern 140*a*, the third capping pattern 140*b*, and the fourth capping pattern 140*c* as an etch mask to form the bit line structure 150, a preliminary key structure 151 and the outer structure 148.

The bit line structure 150 may include a lower conductive pattern 132*a*, a barrier pattern 134*a*, a first metal pattern 136*a*, and the second capping pattern 140*a* sequentially stacked, and the bit line structure 150 may be formed on the semiconductor chip region I of the substrate 100. The preliminary key structure 151 may include the lower conductive pattern 132*a*, the barrier pattern 134*a*, the first metal pattern 136*a*, and the third capping pattern 140*b* sequentially stacked, and the preliminary key structure 151 may be formed on the overlay region III of the substrate 100. The outer structure 148 may be formed outside the boundary of the overlay region III.

The patterning process for forming the bit line structure 150 may be performed using a first overlay key including the third active pattern 107*b* and the isolation pattern 104.

In some example embodiments, the bit line structure 150 may extend in the first direction on the semiconductor chip region I of the substrate 100. A plurality of bit line structures 150 may be spaced apart from each other to have a first distance in the second direction.

In some example embodiments, the preliminary key structure 151 may extend in the first direction on the overlay region III of the substrate 100. A plurality of preliminary key structures 151 may be spaced apart from each other in the second direction. The preliminary key structure 151 may be formed in the second region B of the overlay region III.

A second trench 152 extending in the first direction may be formed between the bit line structures 150 on the semiconductor chip region I of the substrate 100. The first distance may be equal to a width of the second trench 152.

A third trench 154 exposing an edge portion of the overlay region III may be formed in the first region A of the overlay region III of the substrate 100. A bottom of the third trench 154 may face an upper surface of the second active pattern 107*a*. An upper surface of the second insulation layer 122 may be exposed by the bottom of the third trench 154.

A fourth trench 156 serving as a second overlay key may be formed in the second region B of the overlay region III of the substrate 100. A bottom of the fourth trench 156 may face the third active pattern 107*b* and the isolation pattern 104. The upper surface of the second insulation layer 122 may be exposed by the bottom of the fourth trench 156.

The second trench 152 may have a second width. The third trench 154 may have a third width. In some example embodiments, the third width may be equal to or similar to a width of the second active pattern 107*a*. For example, the third width may be in a range of about 1 μm to about 10 μm. The fourth trench 156 may have a fourth width.

The third width may be greater than the fourth width. In addition, the third width and the fourth width may be greater than the second width. The third width may be greater than about 1.5 times the fourth width, for example, the third width may be about 1.5 times to about 5 times the fourth width. The fourth width may be greater than 30 times the second width, for example, the fourth width may be about 30 times to about 100 times the second width.

Figure 12:
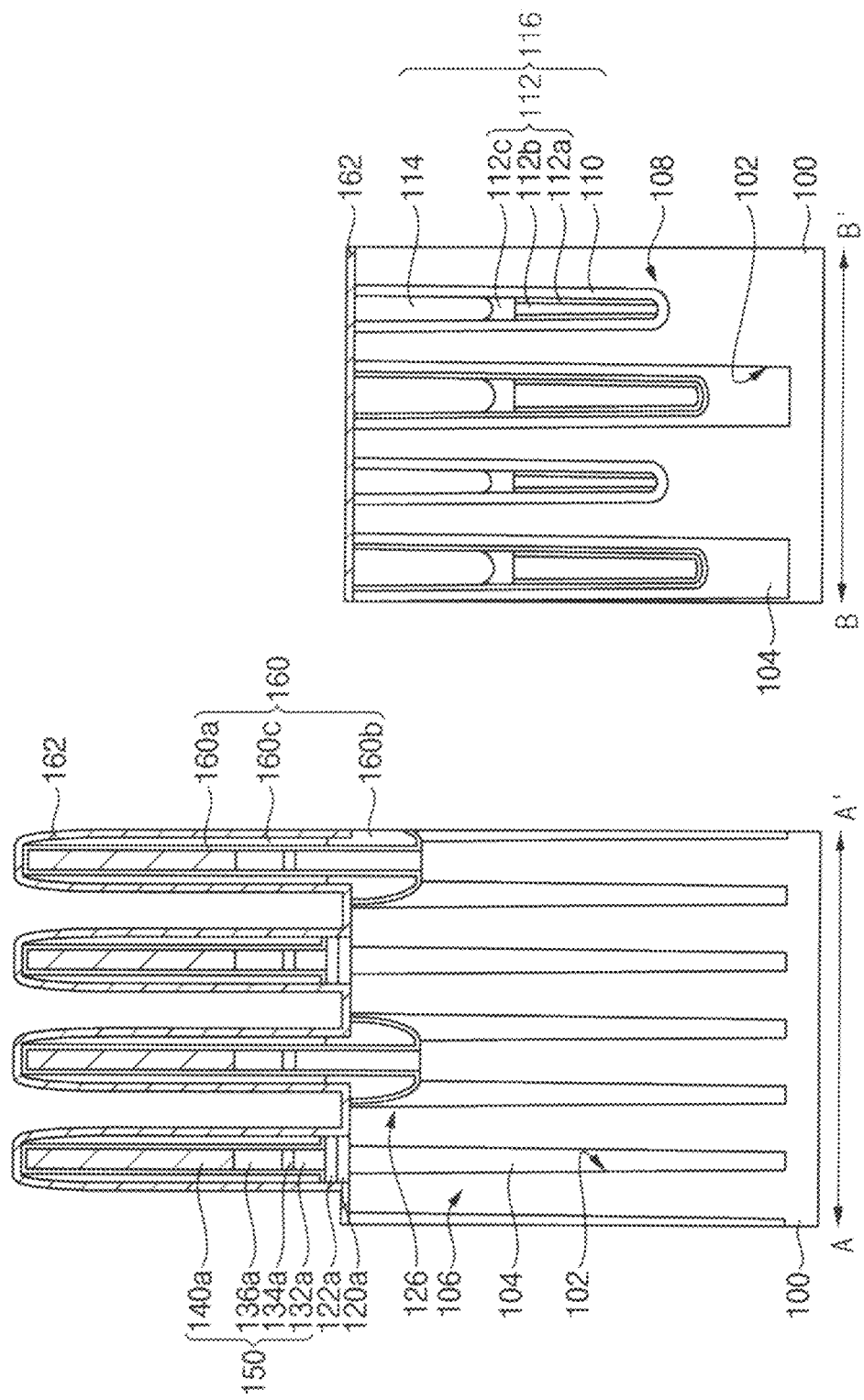
Figure 13:
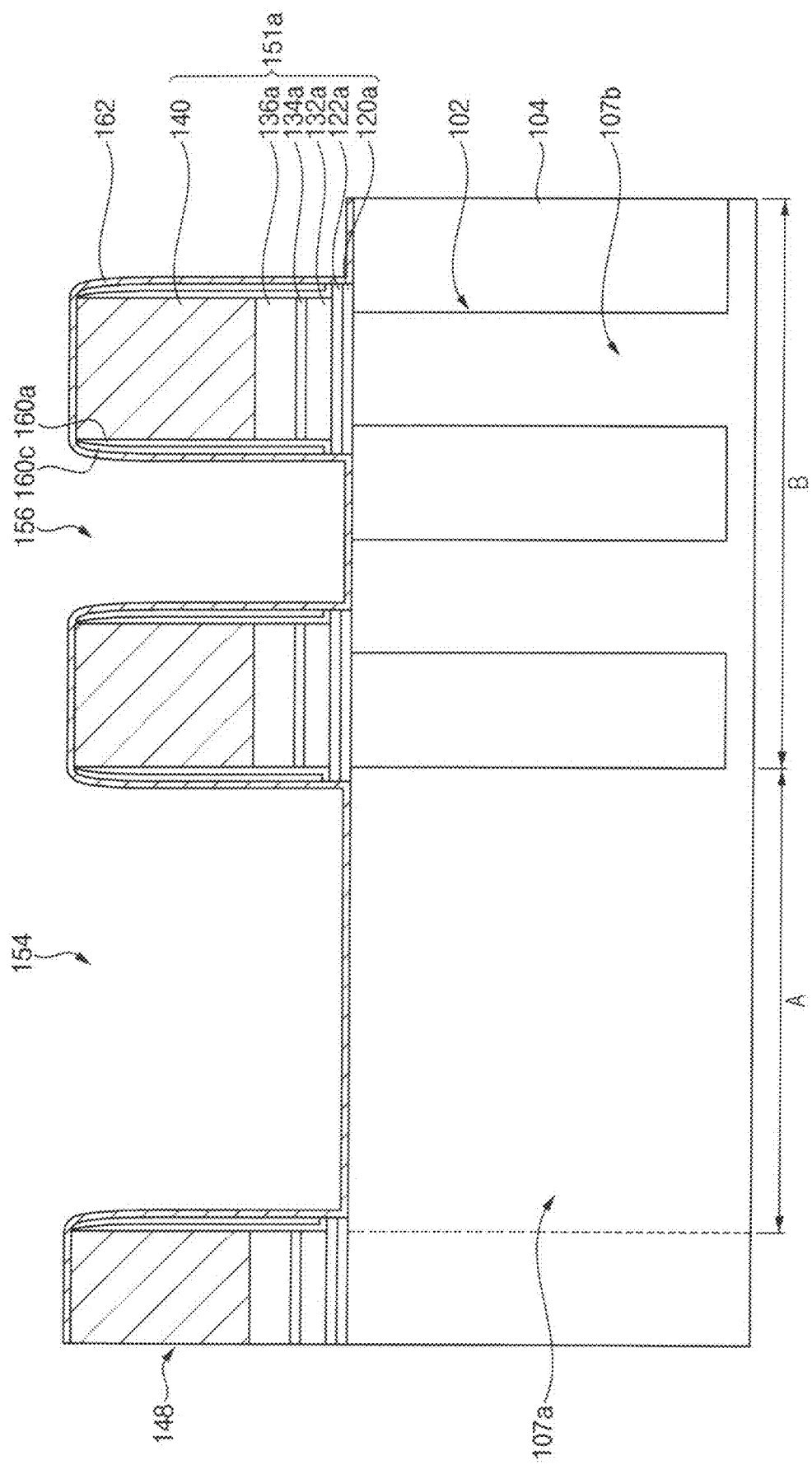

Referring to FIGS. 12 and 13, a spacer structure 160 may be formed on sidewalls of the bit line structure 150 and sidewalls of the preliminary key structure 151. The spacer structure 160 may include an insulation material. The spacer structure 160 may include at least one spacer.

In some example embodiments, the spacer structure 160 may include a plurality of stacked spacers. For example, first to third spacers 160*a*, 160*b*, and 160*c* may be stacked on the sidewalls of the bit line structure 150. For example, first and third spacers 160*a* and 160*c* may be stacked on the sidewalls of the preliminary key structure 151. For example, the first and third spacers 160*a* and 160*c* may include silicon nitride or silicon oxynitride. For example, the second spacer 160*b* may include silicon oxide.

After forming the spacer structure 160, the first and second insulation layers 120 and 122 between the spacer structures 160 may be etched to form first and second insulation patterns 120*a* and 122*a*. Thus, a key structure 151a including the first and second insulation patterns 120a and 122a, the lower conductive pattern 132a, the barrier pattern 134a, the first metal pattern 136a, and the third capping pattern 140b sequentially stacked may be formed on the overlay region III of the substrate 100. The key structure 151a, bit line structure 150, and outer structure 148 may be referred to as parts of a patterned structure.

Thereafter, an outer spacer layer 162 may be conformally formed on the spacer structure 160 and the substrate 100. The outer spacer layer 162 may include silicon nitride or silicon oxynitride.

Figure 14:
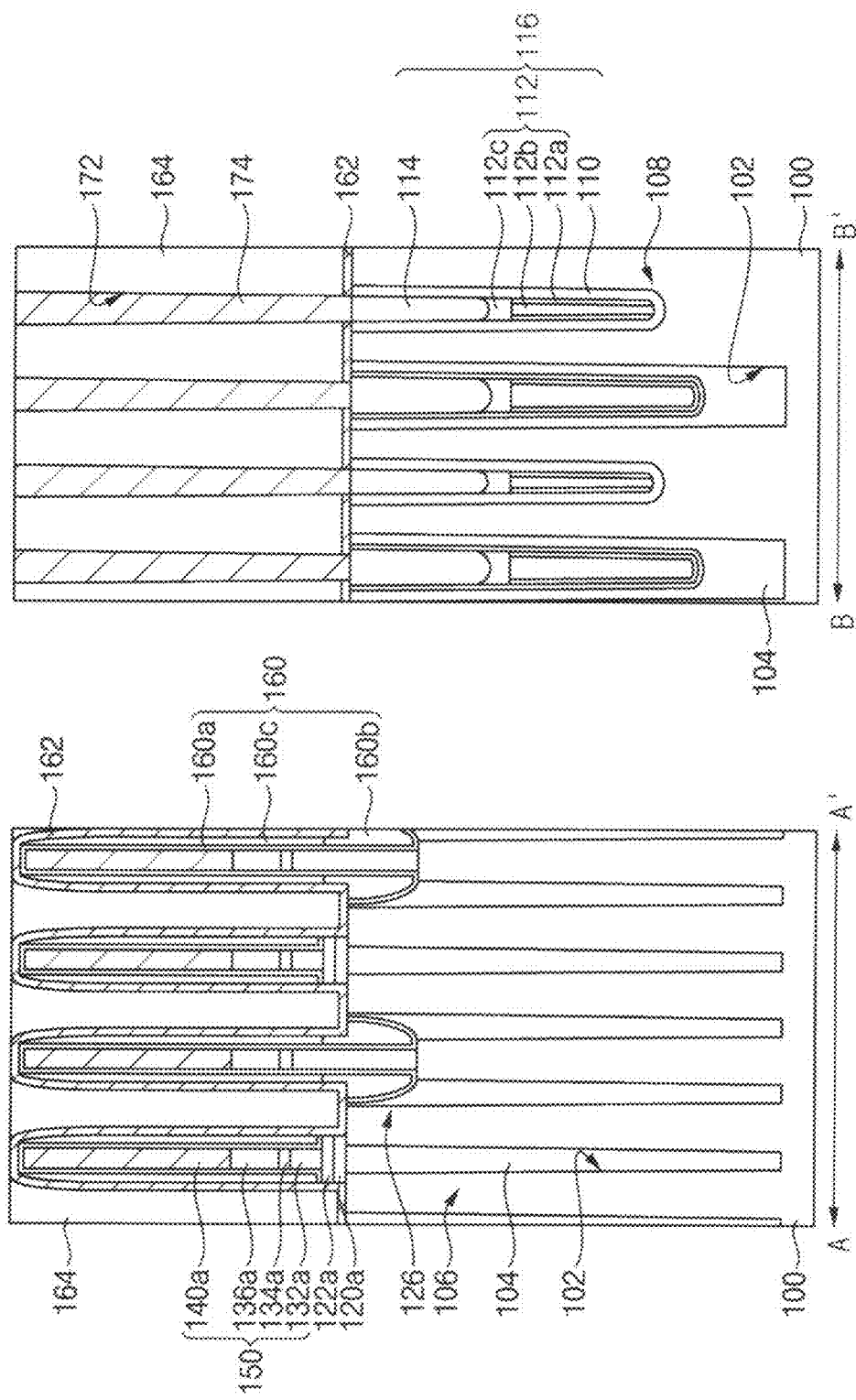
Figure 15:
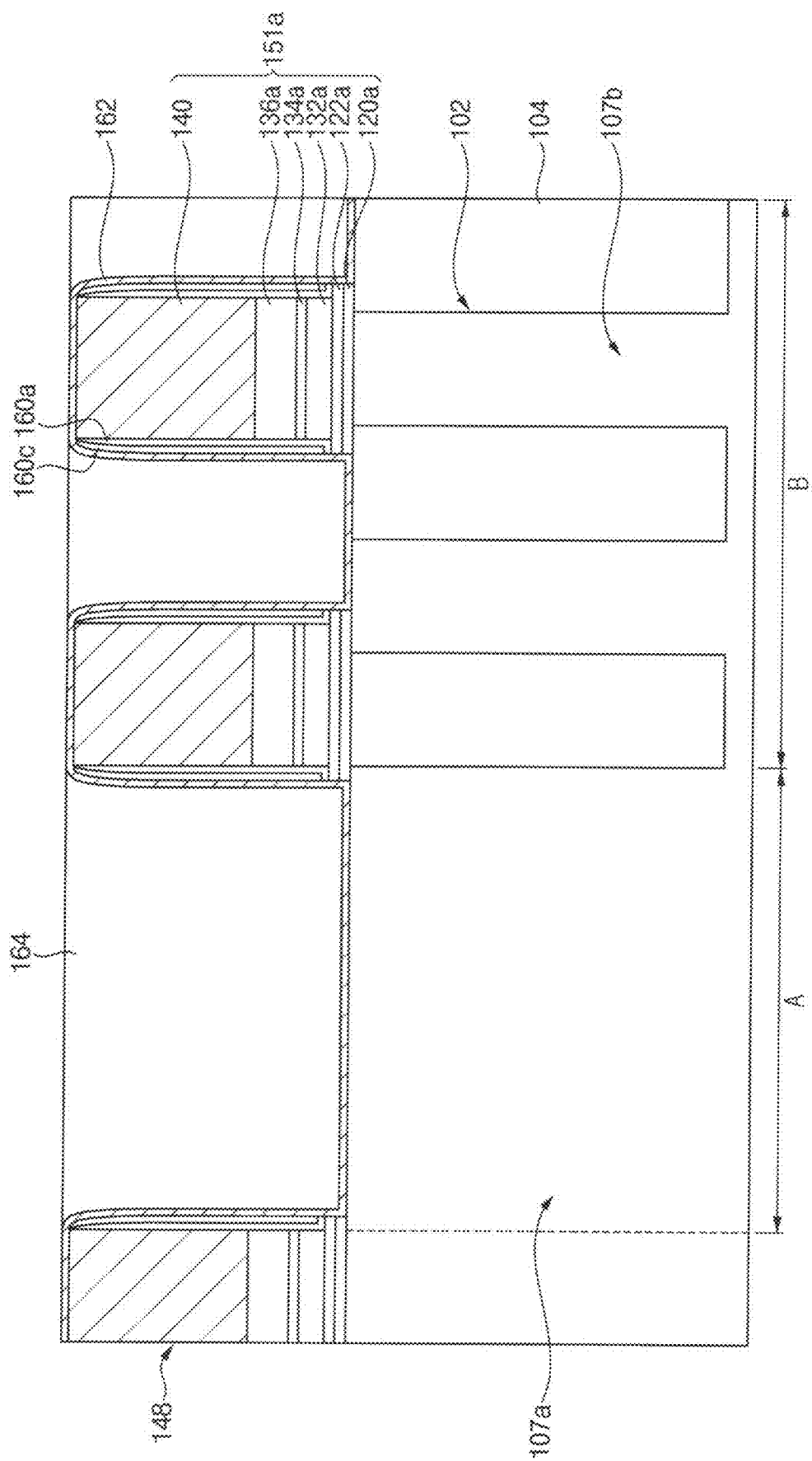

Referring to FIGS. 14 and 15, a filling insulation layer 164 may be formed on the outer spacer layer 162 to fill second to fourth trenches 152, 154, and 156 between the bit line structures 150 and between the key structures 151a. Thereafter, an upper surface of the filling insulation layer 164 may be planarized until an uppermost surface of the outer spacer layer 162 may be exposed. The filling insulation layer 164 may include silicon oxide. For example, the filling insulation layer 164 may include a Tone SilaZene (TOSZ) material.

A first etch mask pattern (not shown) for forming a fence insulation pattern may be formed on the filling insulation layer 164 and the outer spacer layer 162. On the semiconductor chip region I of the substrate 100, the first etch mask pattern may have a line shape extending in the second direction, and a plurality of first etch mask patterns may be spaced apart from each other in the first direction. The first etch mask pattern may expose a portion facing the gate structure 116.

The filling insulation layer 164 and the outer spacer layer 162 positioned on the overlay region III of the substrate 100 may be covered by the first etch mask pattern.

The filling insulation layer 164 may be etched using the first etch mask pattern to form a second opening 172 on the semiconductor chip region I of the substrate 100. The second opening 172 may overlap the gate structure 116. Then, the first etch mask pattern may be removed.

A fence insulation layer may be formed on the filling insulation layer 164 and the outer spacer layer 162 to fill the second opening 172. The fence insulation layer may include, e.g., silicon nitride or silicon oxynitride.

An upper surface of the fence insulation layer may be planarized until upper surfaces of the filling insulation layer 164 and the outer spacer layer 162 may be exposed to form a fence insulation pattern 174 in the second opening 172. Thus, the filling insulation layer 164 may be isolated by the bit line structure 150 and the fence insulation pattern 174.

Figure 16:
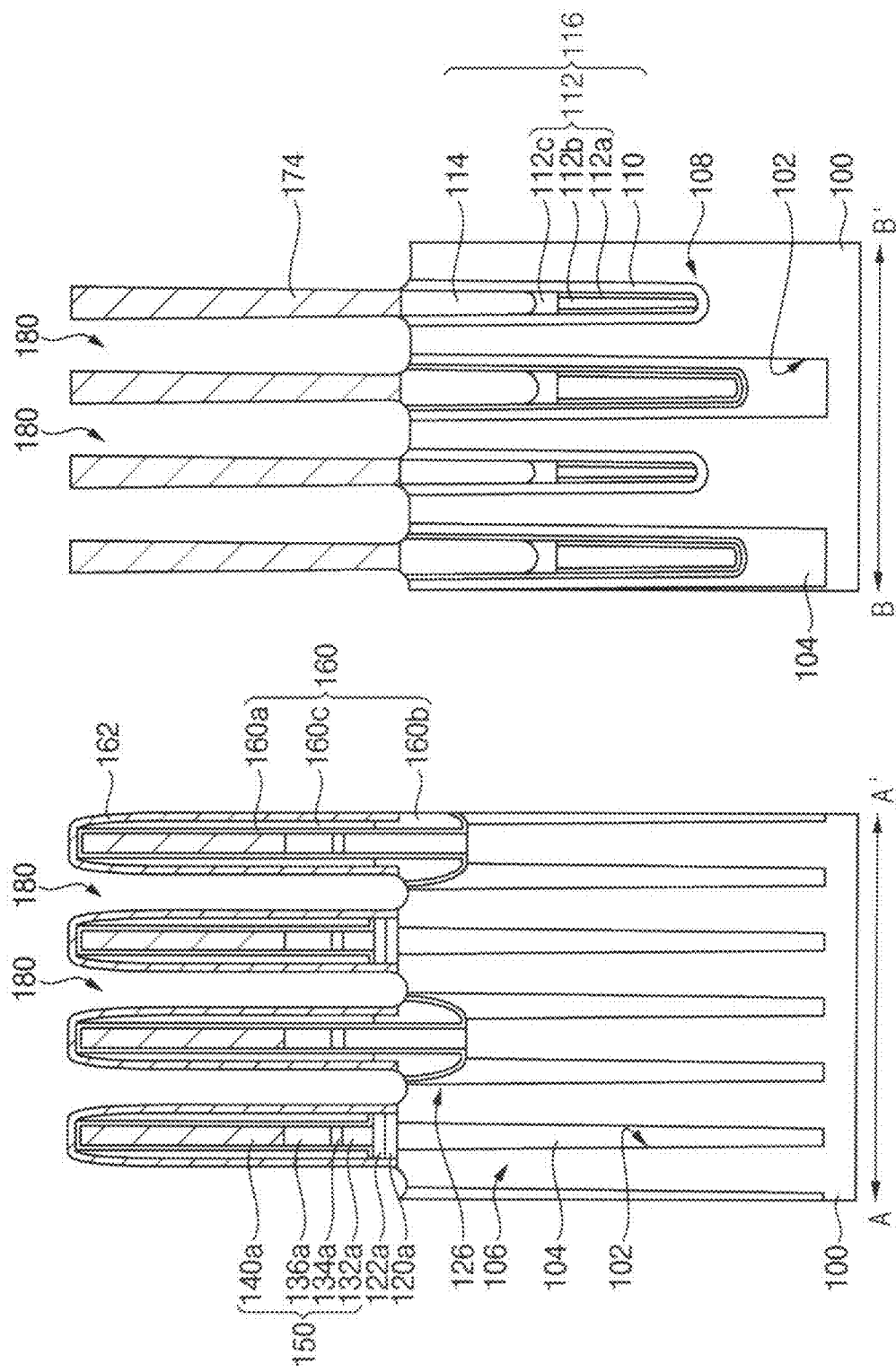
Figure 17:
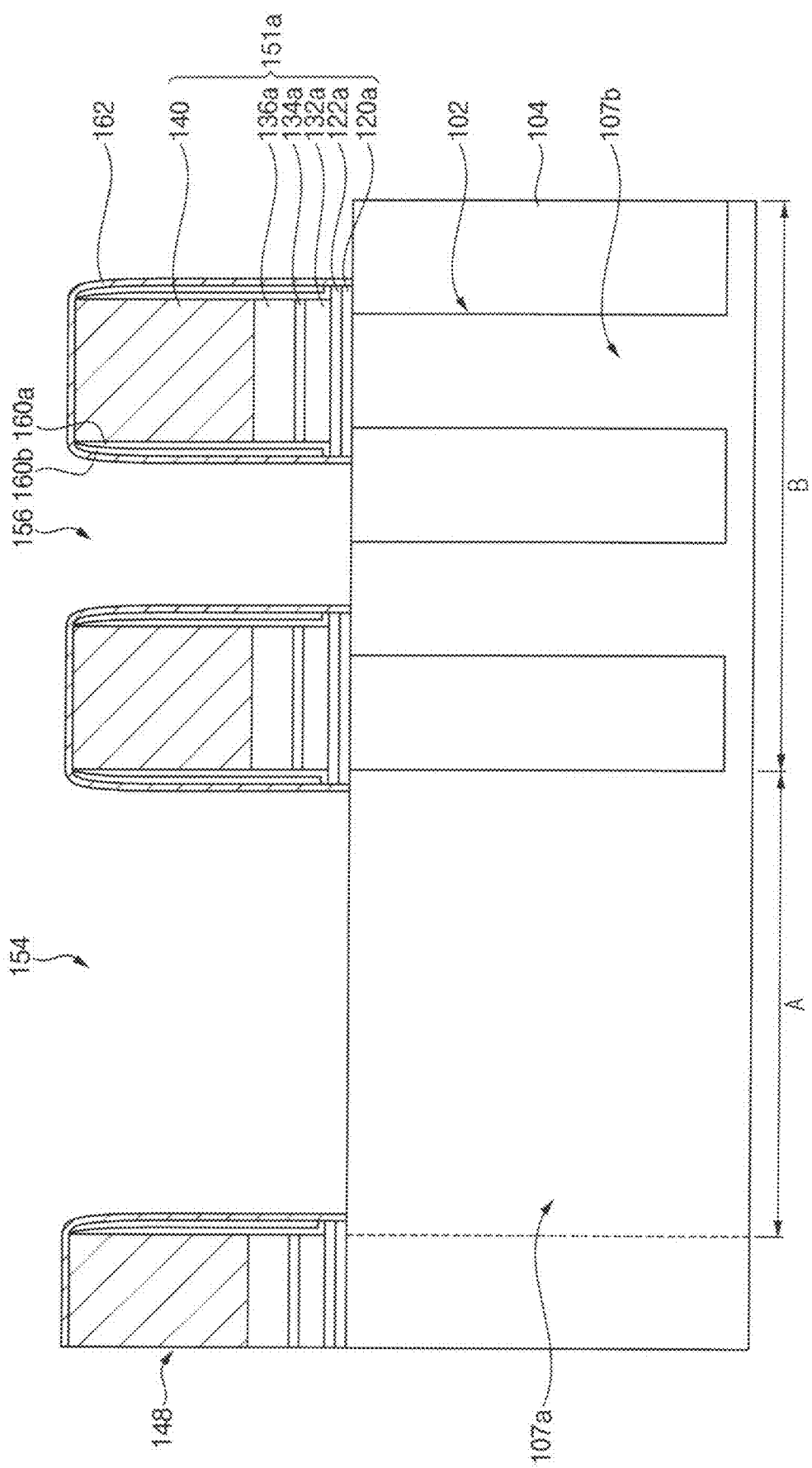
Figure 18:
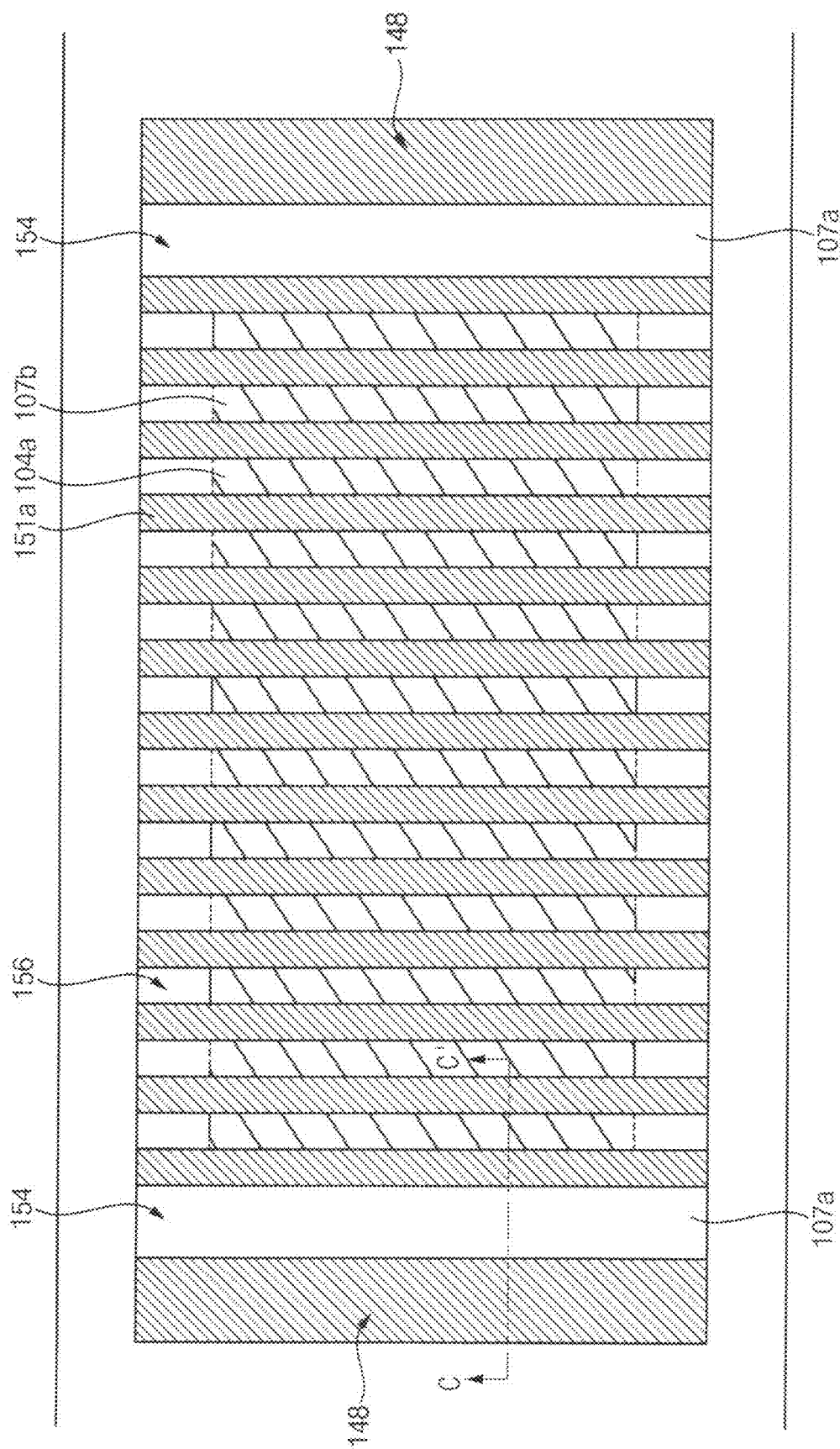

Referring to FIGS. 16 to 18, the filling insulation layer 164 may be removed to form a first preliminary contact hole isolated by the bit line structure 150 and the fence insulation pattern 174. The removing process of the filling insulation layer 164 may include a wet etching process.

In the removing process, the filling insulation layer 164 on the overlay region III of the substrate 100 may be removed together to form the third and fourth trenches 154 and 156 again between the key structures 151a.

Thereafter, in the semiconductor chip region I of the substrate 100, the outer spacer layer 162, the second insulation pattern 122a, and the first insulation pattern 120a positioned at the bottom of the first preliminary contact hole may be additionally etched to form a first contact hole 180. In the etching process, in the overlay region III of the substrate 100, the outer spacer layer 162 on bottoms of the third and fourth trenches 154 and 156 may be removed together.

The first contact hole 180 may expose the first active pattern 106. The second active pattern 107a may be exposed by the bottom of the third trench 154. The isolation pattern may not be exposed by the bottom of the third trench 154. The third active pattern 107b and the isolation pattern 104 may be exposed by the bottom of the fourth trench 156.

Figure 19:
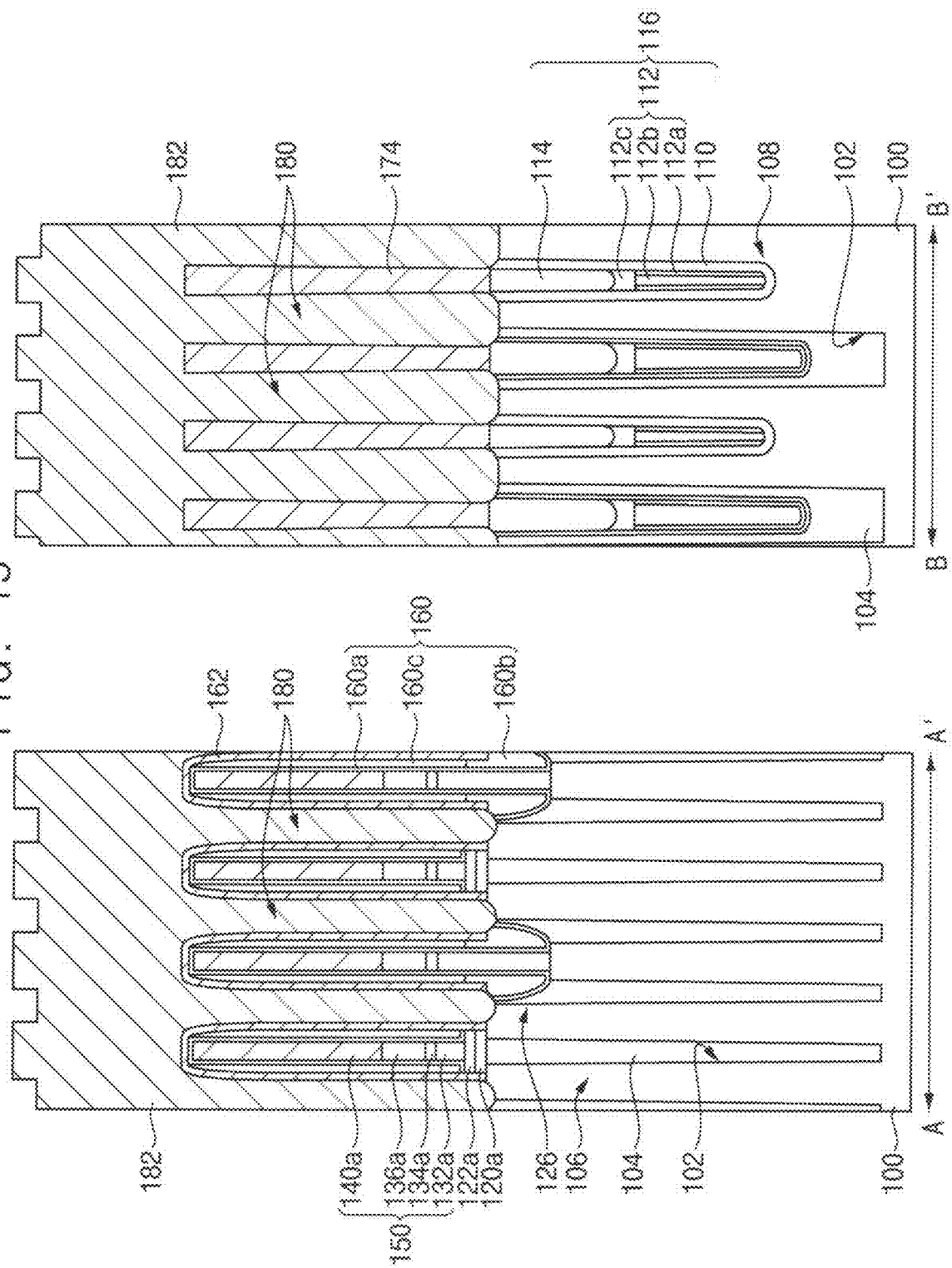
Figure 20:
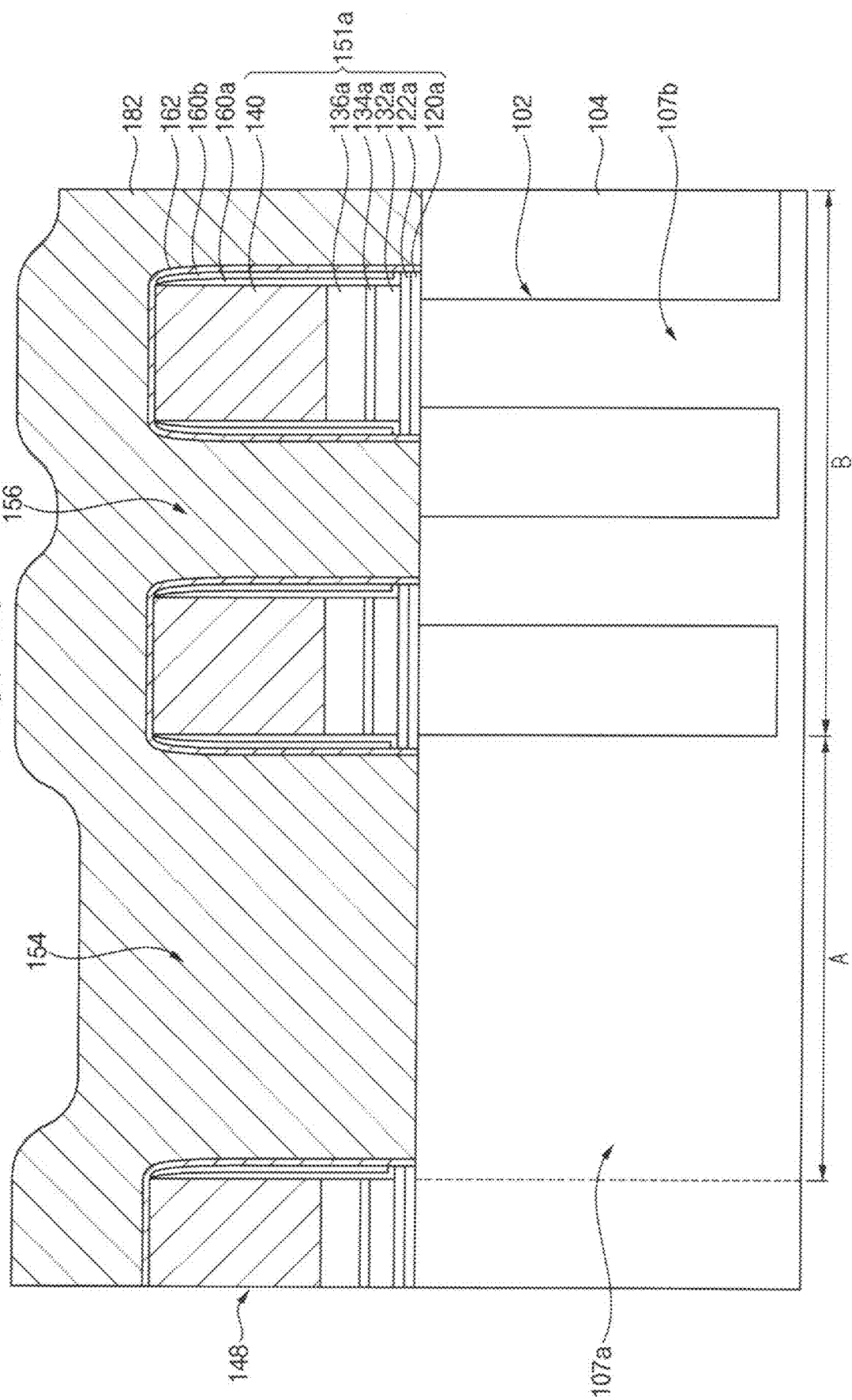

Referring to FIGS. 19 and 20, a lower contact layer 182 may be formed to fill the first contact hole 180, the third trench 154, and the fourth trench 156.

The bit line structures 150 may be formed on the semiconductor chip region I of the substrate 100, and the bit line structures may be spaced apart from each other in the second direction. The key structures 151a may be formed on the overlay region III of the substrate 100, and the key structures 151a may be spaced apart from each other in the second direction. Thus, an upper surface of the lower contact layer 182 not be flat but may have irregularities.

Particularly, a width of the first contact hole 180 may be less than the width of each of the third and fourth trenches 154 and 156. The width of the third trench 154 may be greater than the width of the fourth trench 156. In the overlay region III of the substrate 100, a height of an upper surface of the lower contact layer 182 on each of the third and fourth trenches 154 and 156 may be much lower than a height of an upper surface of the lower contact layer 182 on the key structure 151a. A height of an upper surface of the lower contact layer 182 on the third trench 154 may be lower than a height of an upper surface of the lower contact layer 182 on each of the first contact hole and the fourth trench 156.

In some example embodiments, the lower contact layer 182 may include, e.g., polysilicon doped with impurities.

In the semiconductor chip region I of the substrate 100, the lower contact layer 182 may contact the first active pattern 106. In the overlay region III of the substrate 100, the lower contact layer 182 formed on the first region A may contact the second active pattern 107a. In the overlay region III of the substrate, the lower contact layer 182 formed on the second region B may contact the third active pattern 107b and the isolation pattern.

Figure 21:
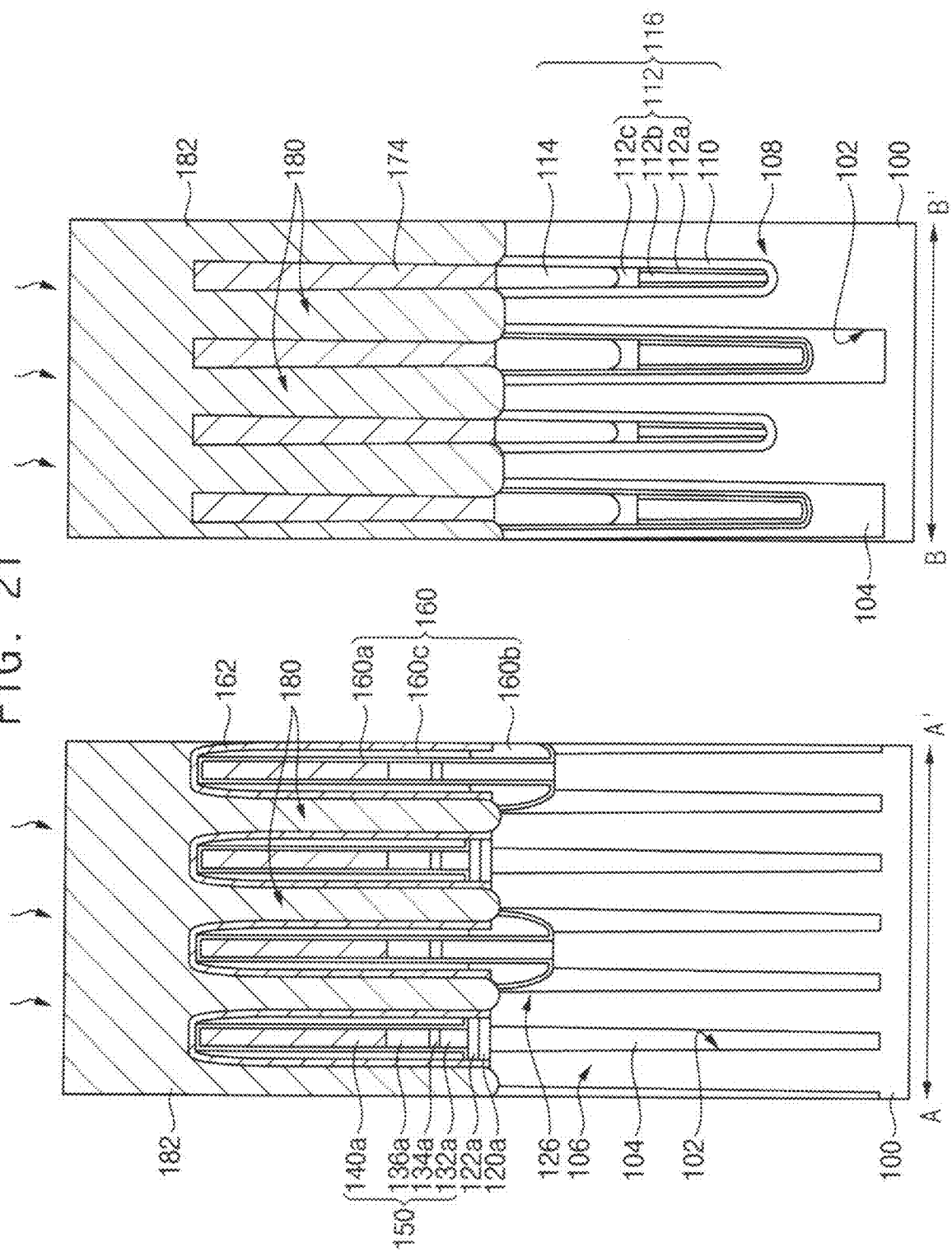
Figure 22:
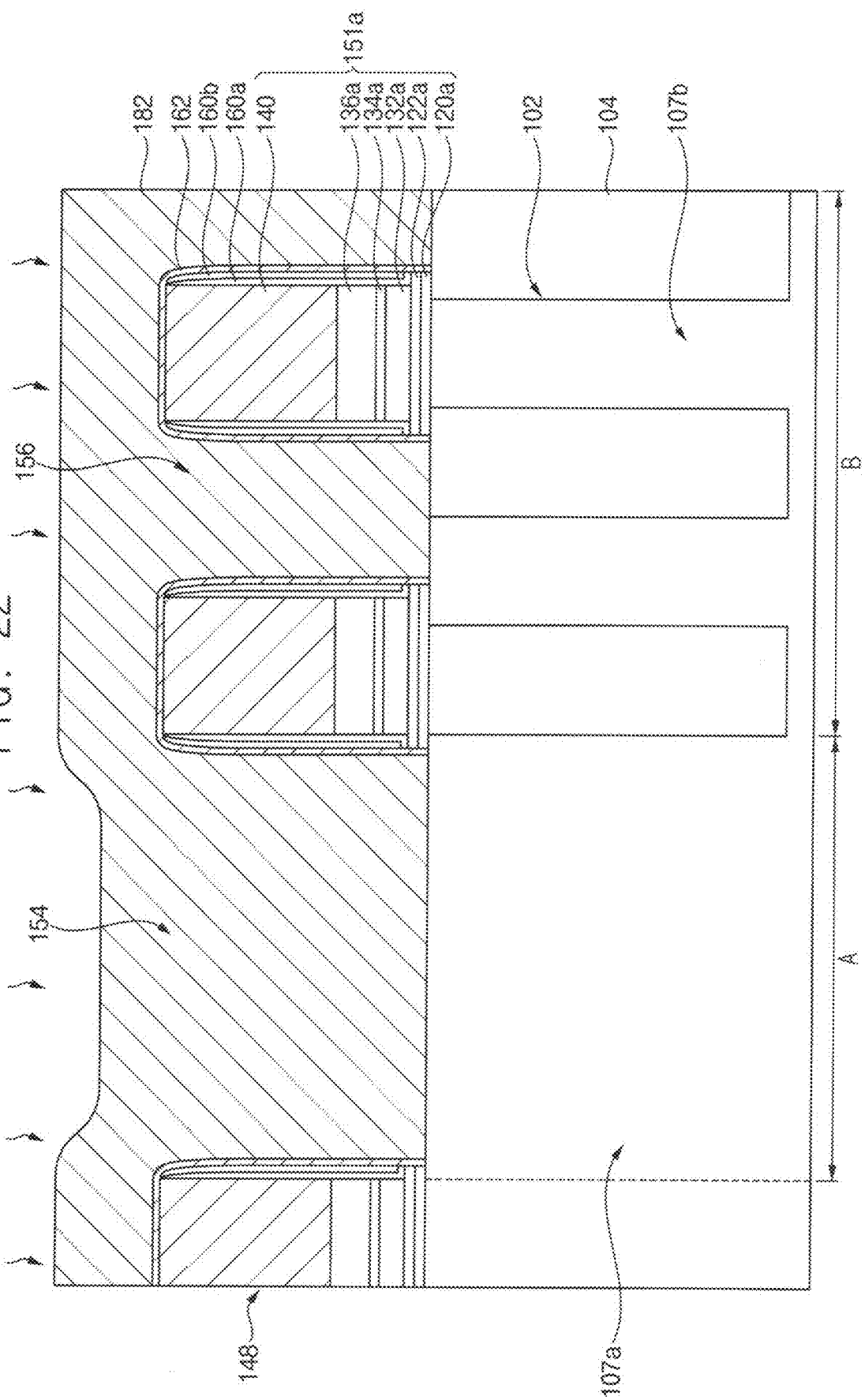

Referring to FIGS. 21 and 22, a melting process may be performed on the lower contact layer 182. In some example embodiments, the melting process may include a laser annealing process.

Thus, the flexibility of the lower contact layer 182 may be enhanced so that irregularities and a height difference between upper surfaces of portions of the lower contact layer 182 may be considerably decreased. Particularly, in the overlay region III of the substrate 100, the height difference between the upper surface of the lower contact layer 182 on each of the third and fourth trenches 154 and 156 and the upper surface of the lower contact layer 182 on the key structure 151a may be greatly relieved.

Figure 23:
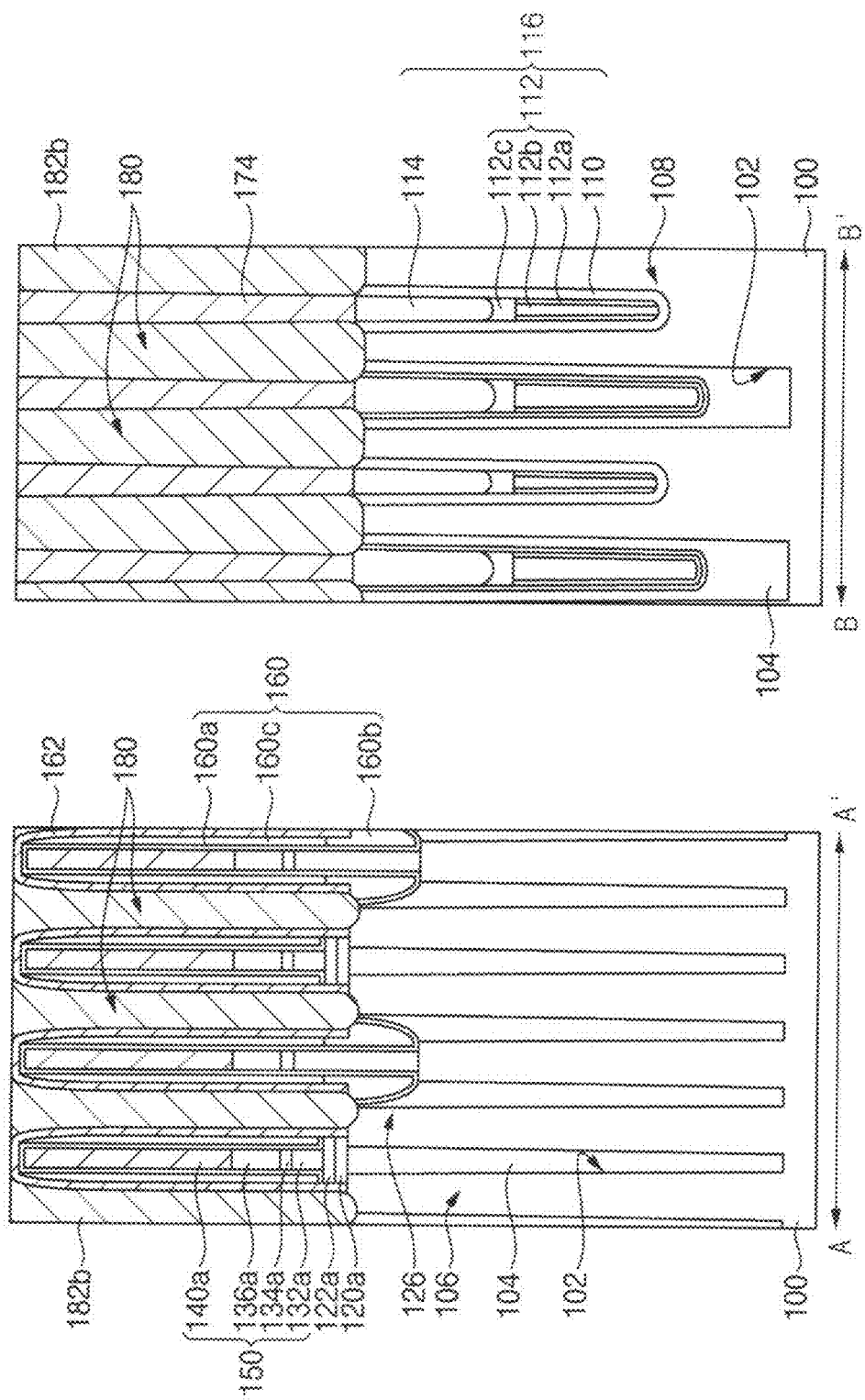
Figure 24:
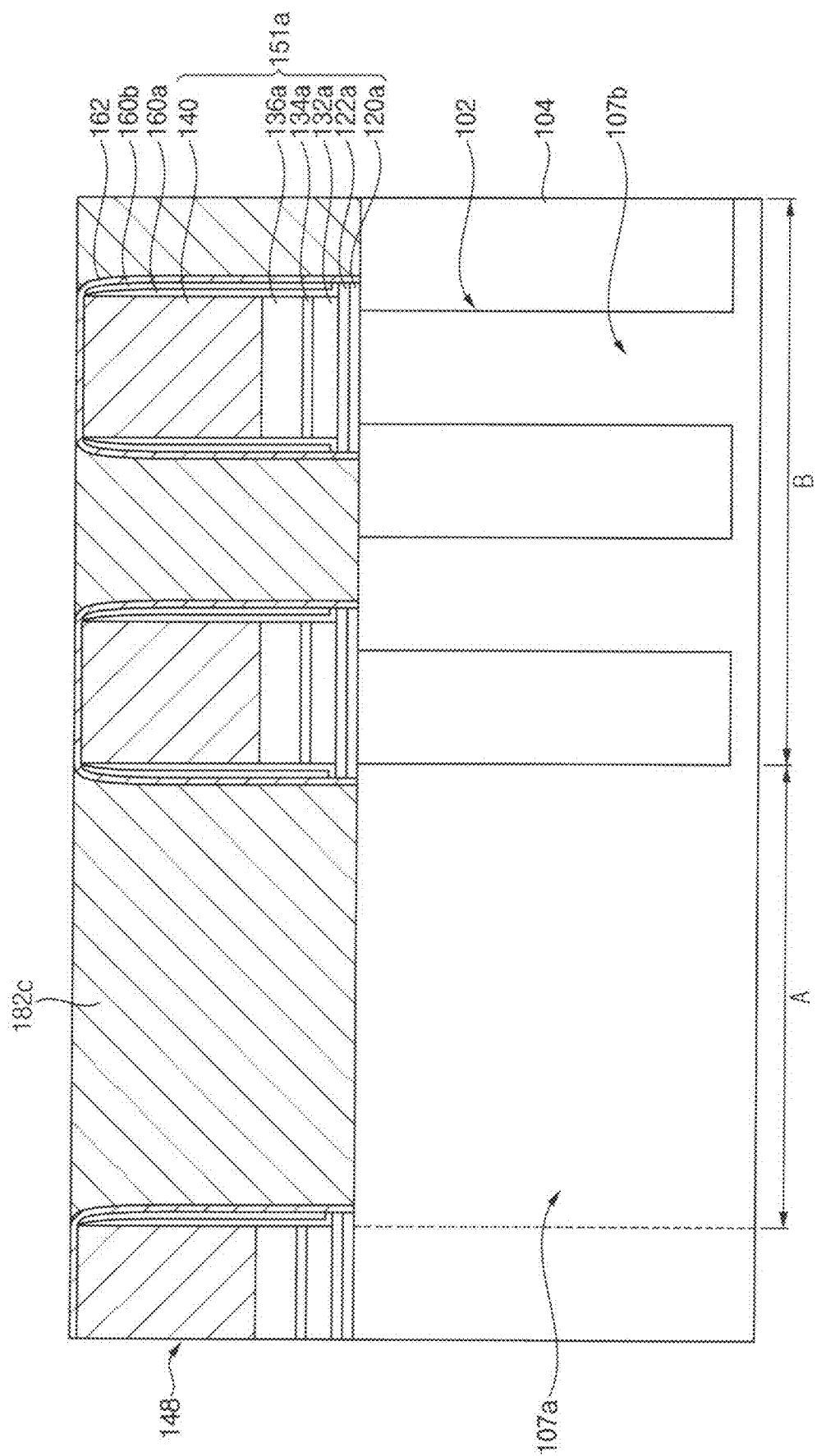

Referring to FIGS. 23 and 24, the upper surface of the lower contact layer 182 may be planarized until the outer spacer layer 162 on the second and third capping patterns 140a and 140b may be exposed to form a preliminary lower contact plug 182b and a preliminary filling pattern 182c. The preliminary lower contact plug 182b may be formed between the bit line structures 150, and the preliminary filling pattern 182c may be formed between the key structures 151a.

The planarization process may include a chemical mechanical polishing (CMP) process. As described above, the height difference between the upper surfaces of the portions of the lower contact layer 182 may be relieved by the melting process, so that dishing defects may be reduced during the CMP process. Thus, each of the preliminary lower contact plug 182b and the preliminary filling pattern 182c may have a flat upper surface. That is, the upper surface of the preliminary lower contact plug 182*b* between the bit line structures 150 and the upper surface of the preliminary filling pattern 182*c* between the key structures 151*a* may have substantially the same height. The upper surface of the outer spacer layer 162 on the bit line structures 150 and the upper surface of the preliminary lower contact plug 182*b* may have substantially the same height. The upper surface of the outer spacer layer 162 on the key structures 151*a* and the upper surface of the preliminary filling pattern 182*c* may have substantially the same height.

Figure 25:
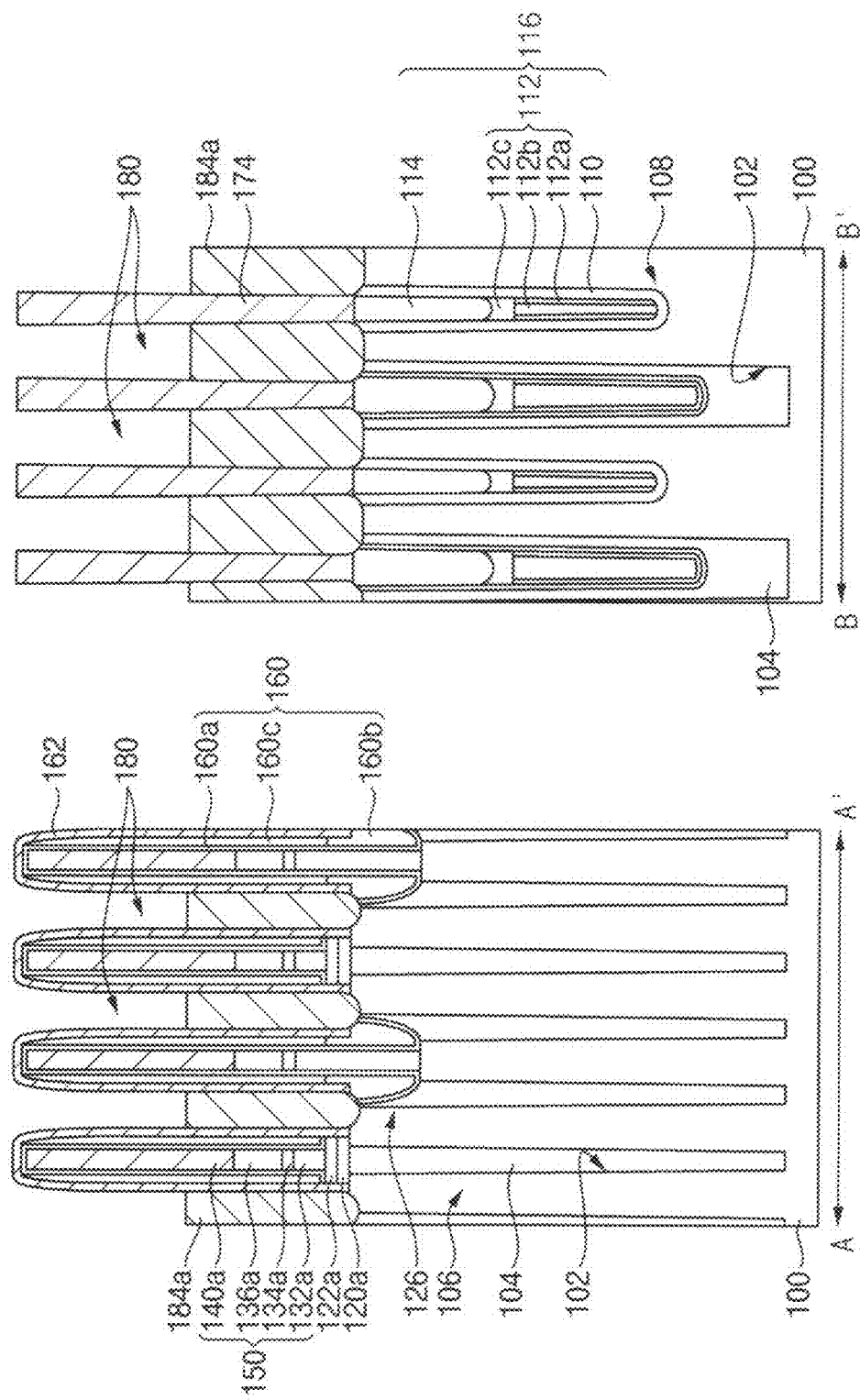
Figure 26:
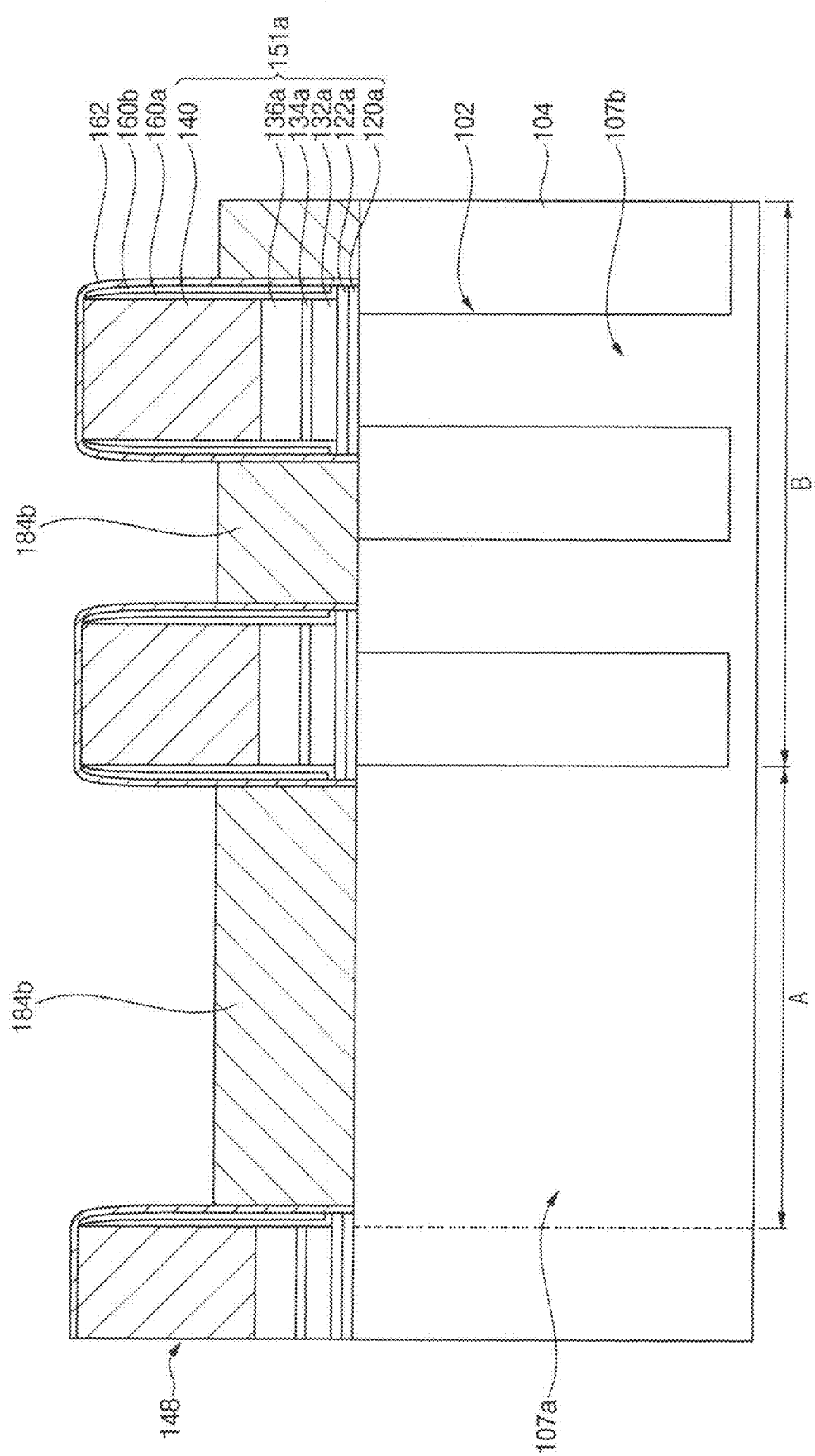
Figure 27:
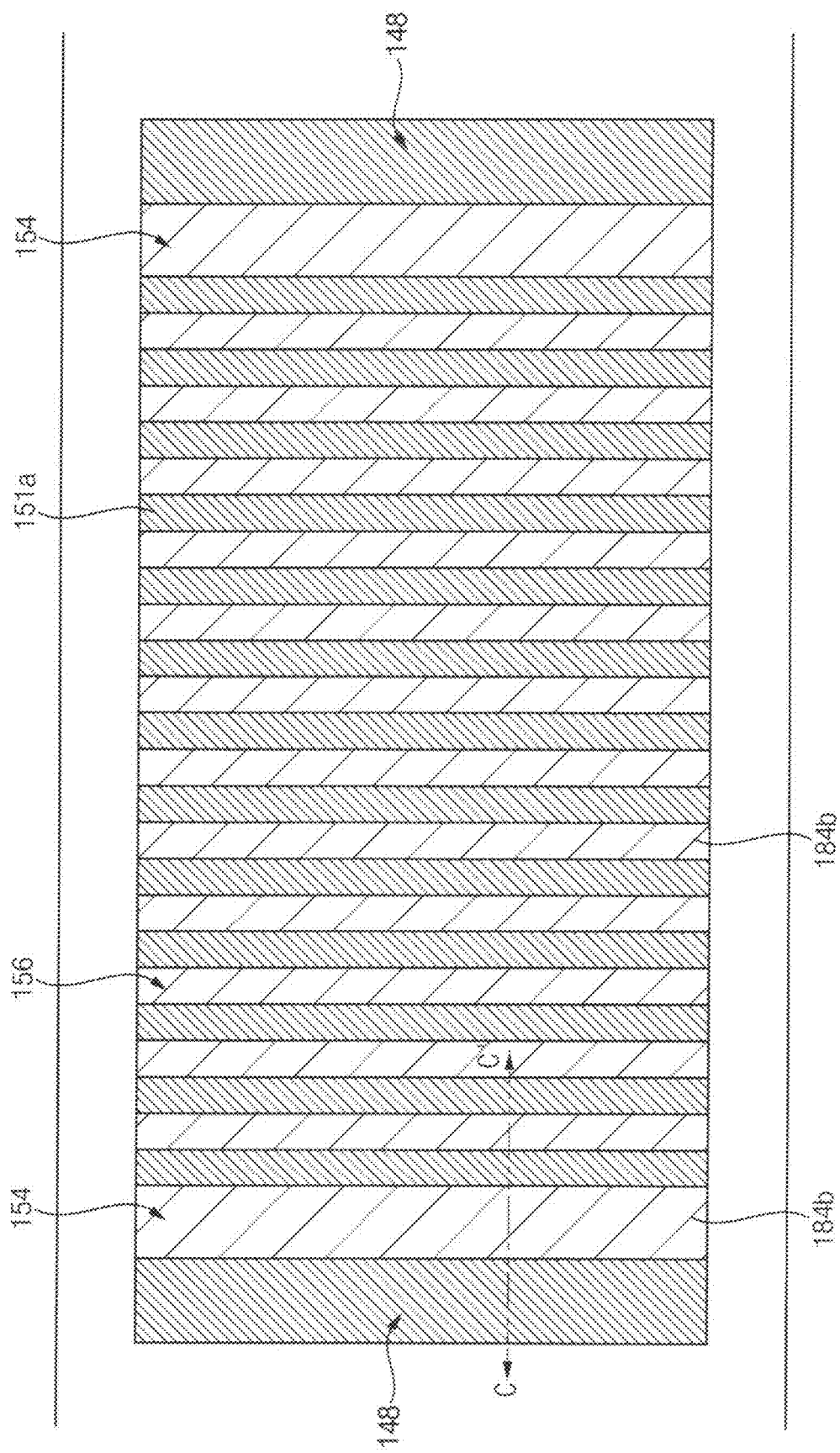

Referring to FIGS. 25 to 27, upper portions of the preliminary lower contact plug 182*b* and the preliminary filling pattern 182*c* may be etched to form a lower contact plug 184*a* and a filling pattern 184*b*.

In some example embodiments, upper portions of the preliminary lower contact plug 182*b* and the preliminary filling pattern 182*c* may be removed by an etch back process. As described above, the upper surfaces of the preliminary lower contact plug 182*b* and the preliminary filling pattern 182*c* may have substantially the same height, and thus the preliminary lower contact plug 182*b* and the preliminary filling pattern 182*c* have a predetermined thickness after the etch back process.

In some example embodiments, upper surfaces of the lower contact plug 184*a* and the filling pattern 184*b* may have substantially the same height. That is, the upper surfaces of the lower contact plug 184*a* and the filling pattern 184*b* may be coplanar with each other, after the etch back process. In some example embodiments, the upper surfaces of the lower contact plug 184*a* and the filling pattern 184*b* may not be coplanar with each other, after the etch back process.

In the first region A, the filling pattern 184*b* may directly contact the upper surface of the second active pattern 107*a*. In the second region B, the filling pattern 184*b* may directly contact upper surfaces of the third active pattern 107*b* and the isolation pattern 104.

As described above, the filling pattern 184*b* may fill the lower portions of the third and fourth trenches 154 and 156 in the overlay region III, so that the second and third active patterns 107*a* and 107*b* and the isolation pattern 104 in the overlay region III may not be exposed by the lower portions of the third and fourth trenches 154 and 156.

Unlike the example embodiment, as shown in FIGS. 19 and 20, if the etch back process is performed immediately after forming the lower contact layer 182 filling the first contact hole 180, the third trench 154, and the fourth trench 156, all the lower contact layer having a lowest height in the third trench and the second active pattern therebelow may be excessively removed during forming the lower contact structure in the semiconductor chip region. Therefore, the overlay key may not be formed normally.

However, according to some example embodiments, since the filling pattern 184*b* remains on the bottom of the third and fourth trenches 154 and 156 after the etch back process, the active pattern 107*a* and the third active pattern 107*b* may not be damaged by the etch back process.

Figure 28:
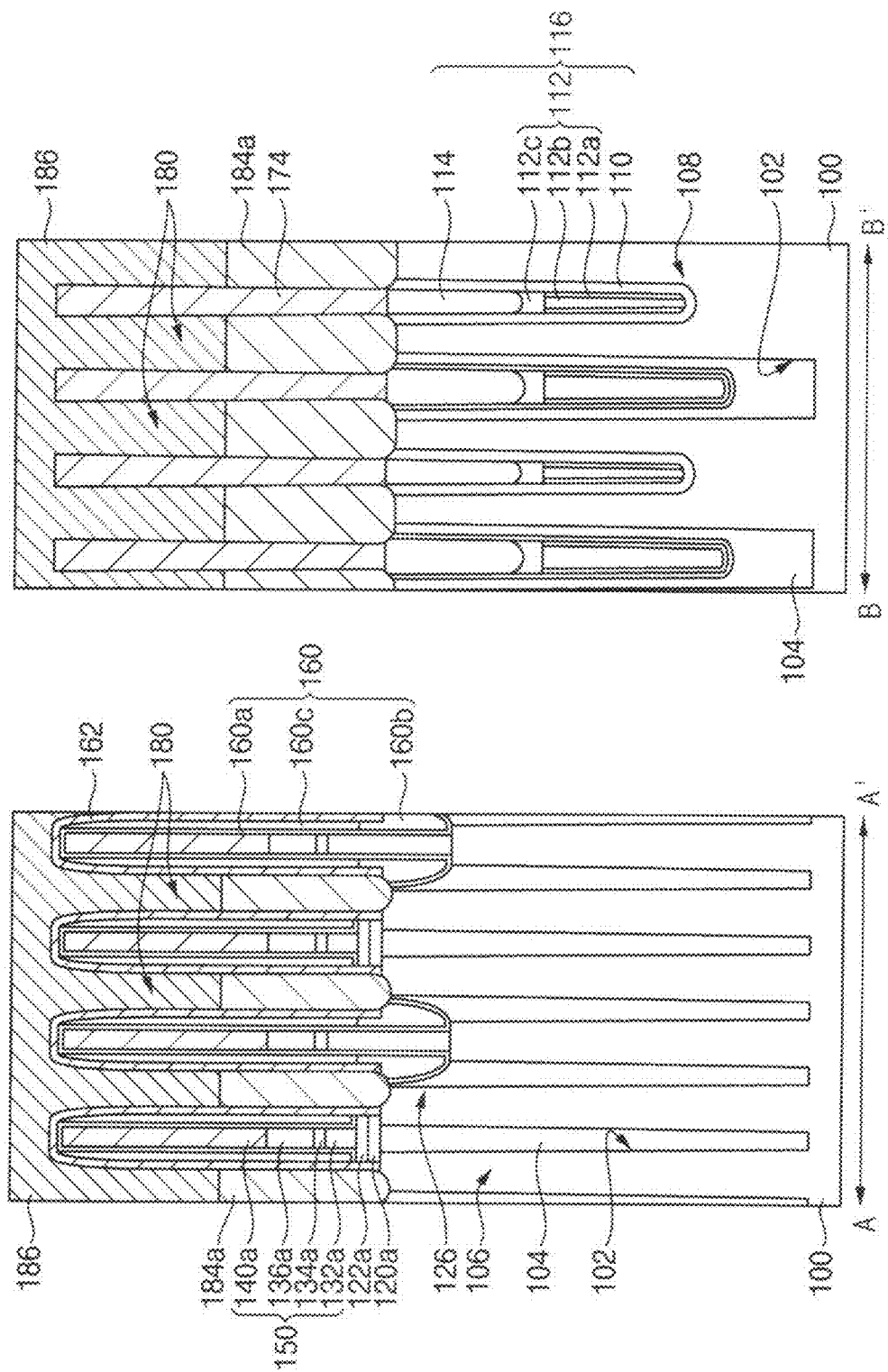
Figure 29:
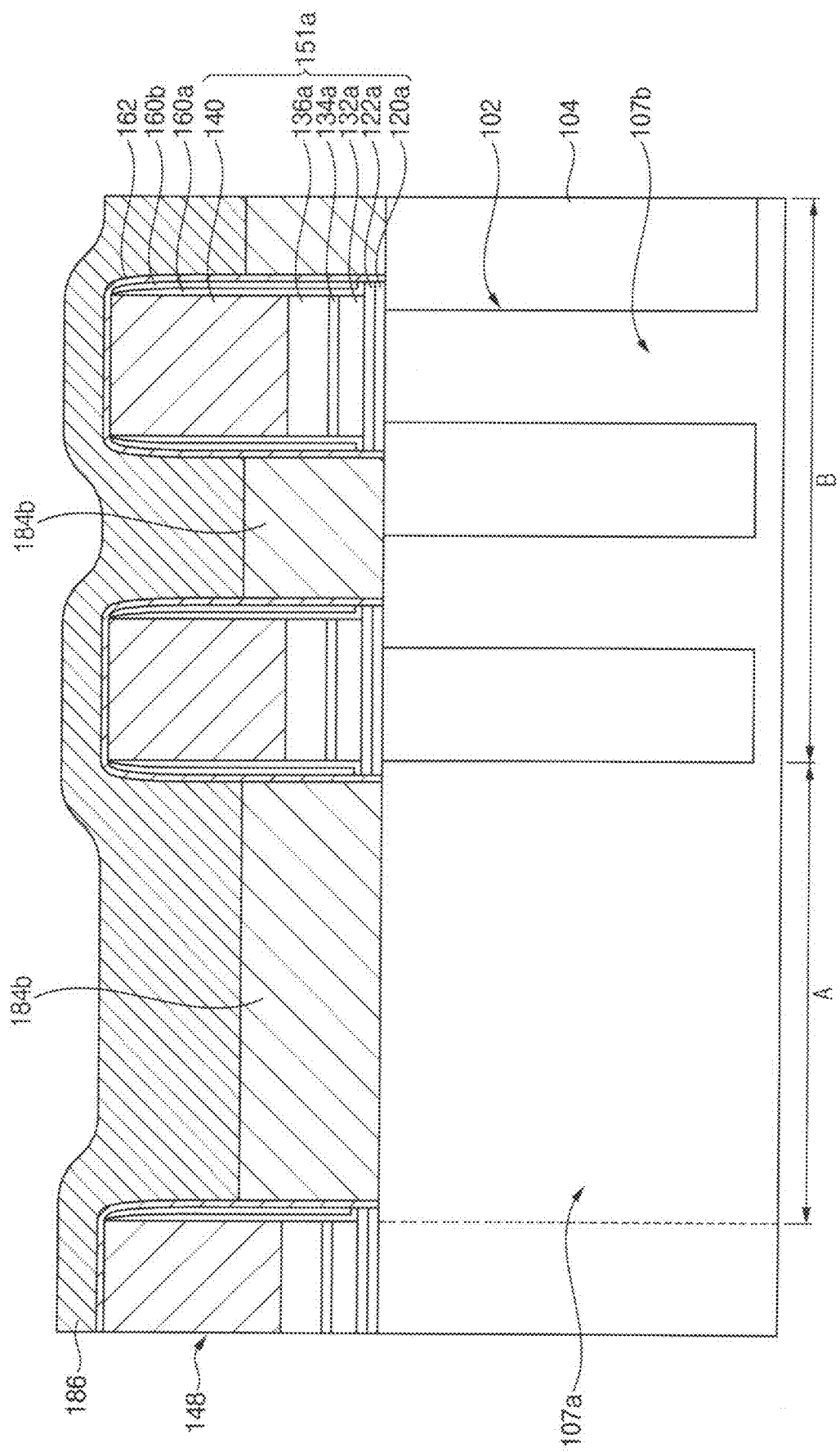

Referring to FIGS. 28 and 29, an upper contact layer 186 may be formed on the outer spacer layer 162, the lower contact plug 184*a*, and the filling pattern 184*b*.

The upper contact layer 186 may be formed to fill the first contact hole 180 and the third and fourth trenches 154 and 156. In the overlay region III of the substrate 100, a height of an upper surface of the upper contact layer 186 on the third and fourth trenches 154 and 156 may be lower than a height of an upper surface of the upper contact layer 186 on the key structure 151*a*. The height of the upper surface of the upper contact layer 186 on the third trench 154 may be lower than the height of the upper surface of the upper contact layer 186 on each of the first contact hole 180 and the fourth trench 156. However, since the filling pattern 184*b* is included in the third and fourth trenches 154 and 156, a height difference among upper portions of the upper contact layer 186 may decrease compared to the case where the filling pattern is not included in the third and fourth trenches 154 and 156.

In some example embodiments, the upper contact layer 186 may include for example, a metal such as tungsten.

Thereafter, the upper surface of the upper contact layer 186 may be planarized by a chemical mechanical polishing (CMP) process. The upper surfaces of the bit line structure 150 and the key structure 151*a* may not be exposed by the CMP process. The upper surface of a portion of the upper contact layer 186 may be higher than the upper surfaces of the bit line structure 150 and the key structure 151*a*.

Figure 30:
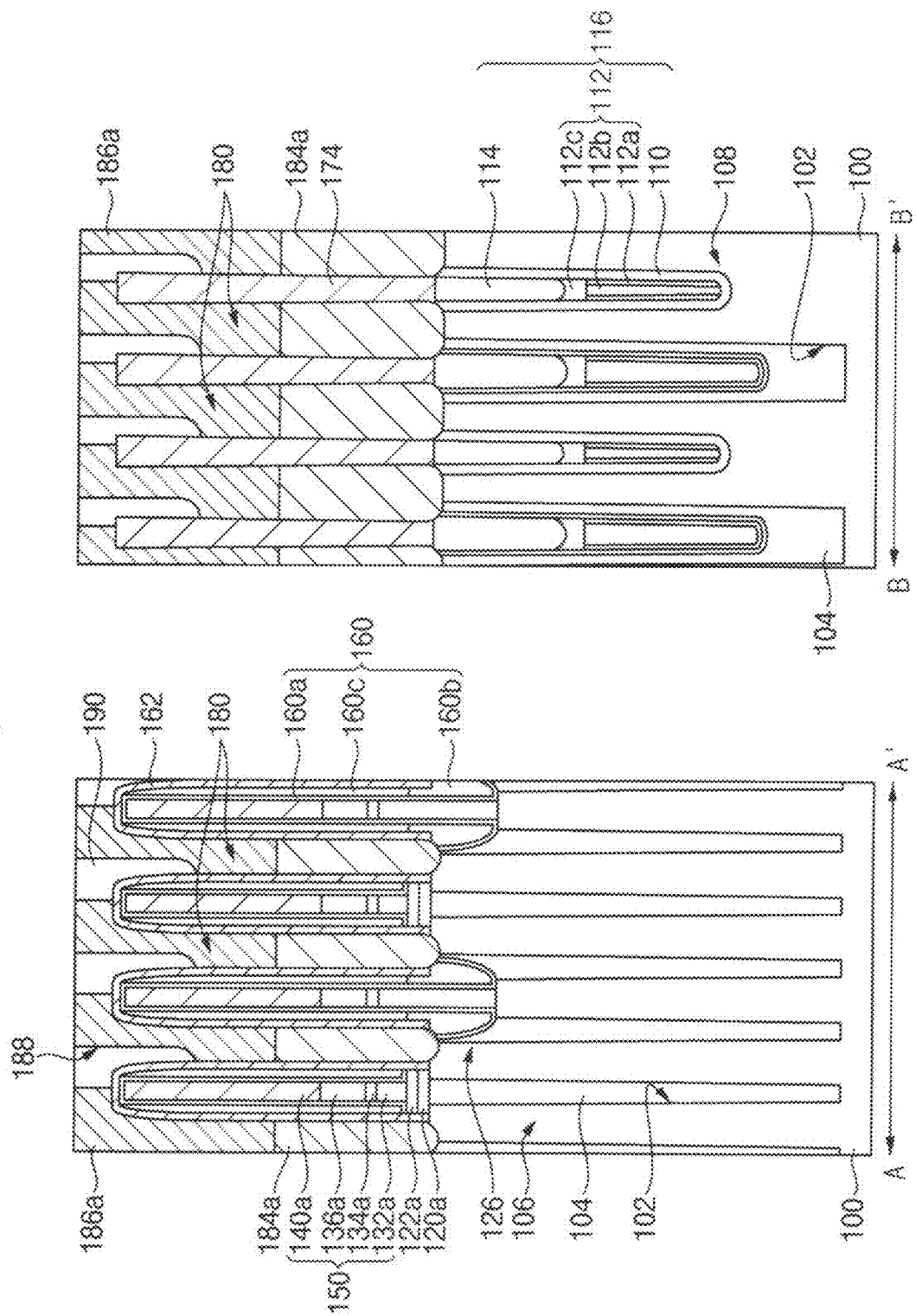
Figure 31:
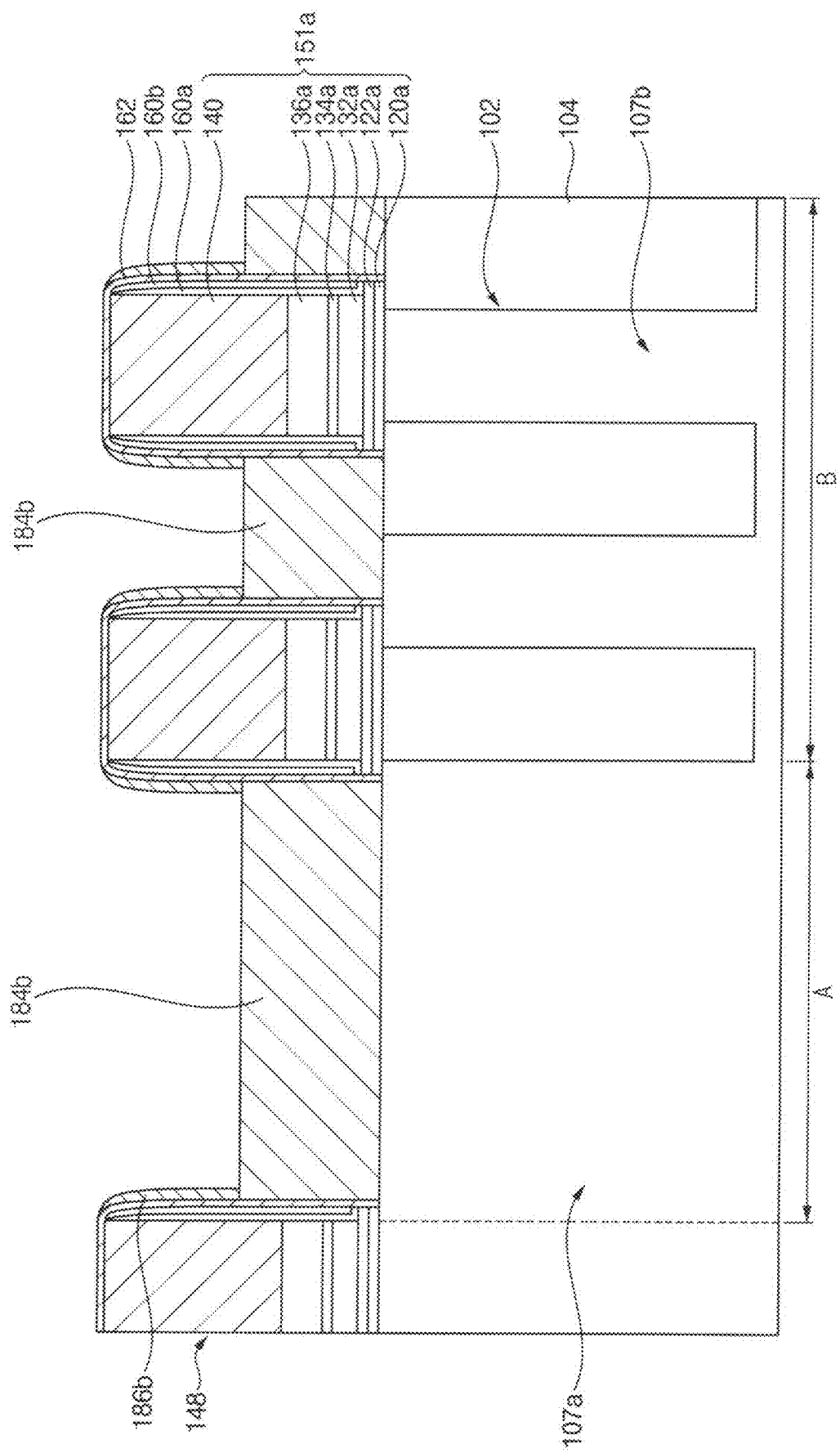

Referring to FIGS. 30 and 31, a portion of the upper contact layer 186 in the semiconductor chip region I of the substrate 100 may be anisotropically etched to form an upper contact plug 186*a* on the lower contact plug 184*a*. The upper contact layer 186 on the overlay region III may be anisotropically etched.

A third opening 188 may be formed between the upper contact plugs 186*a* by the anisotropic etching process. In the semiconductor chip region I of the substrate 100, a stacked structure of the lower contact plug 184*a* and the upper contact plug 186*a* may serve as a storage node contact.

When the upper contact layer 186 on the overlay region III is removed by anisotropic etching, a portion of the upper contact layer 186 may left on upper sidewalls of the third and fourth trenches 154 and 156 to form a conductive spacer 186*b*. That is, the conductive spacer 186*b* may be formed only on the upper sidewalls of the third and fourth trenches 154 and 156 that are higher than an upper surface of the filling pattern 184*b*.

In the overlay region, the key structure 151*a* and the fourth trench 156 on the third active pattern 107*b* may serve as a second overlay key. That is, the key structure 151*a* may serve as a key structure of the second overlay key. A portion of the fourth trench 156 higher than the upper surface of the filling pattern 184*b* may serve as an actual trench of the second overlay key.

Figure 32:
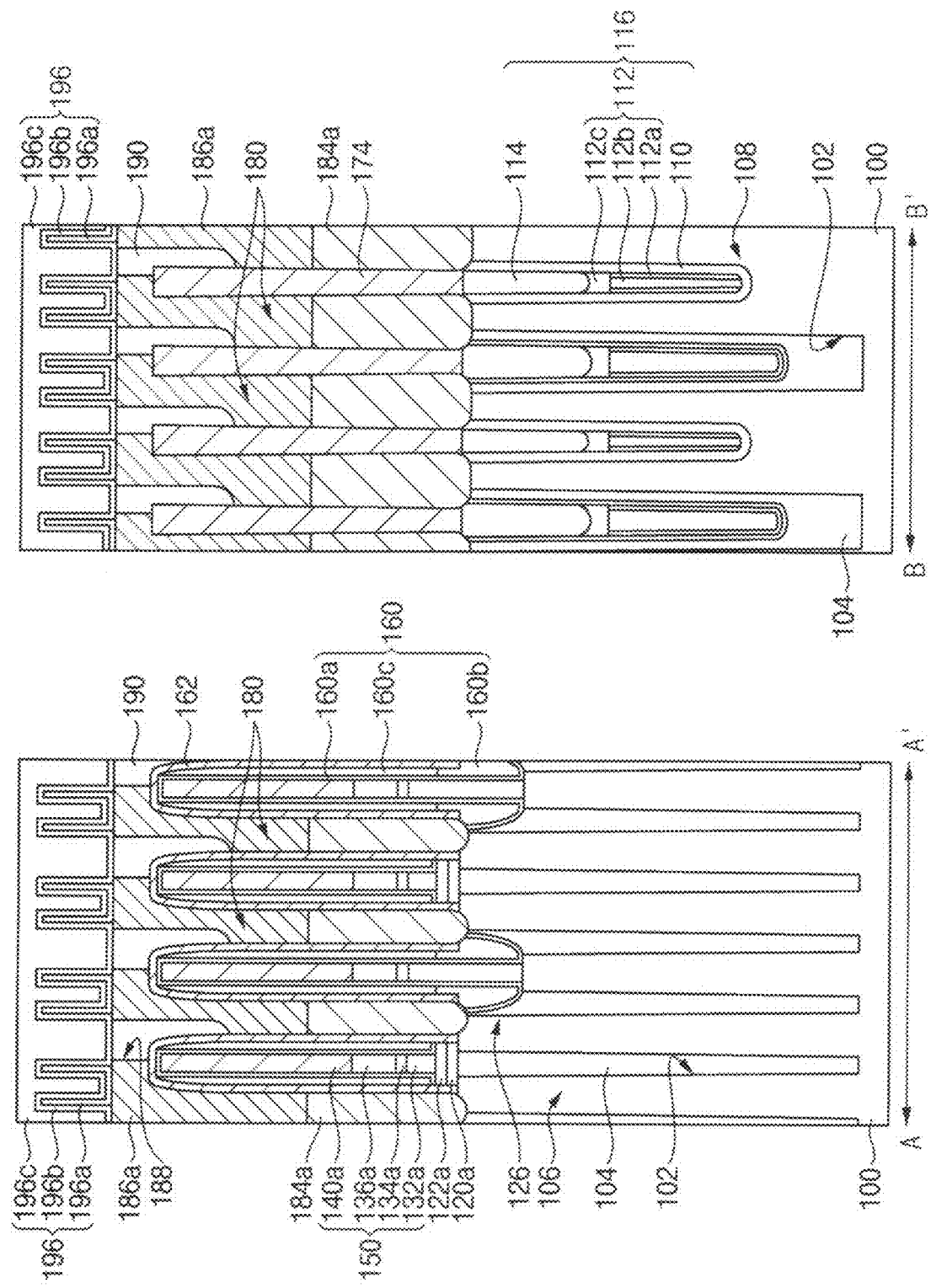
Figure 33:
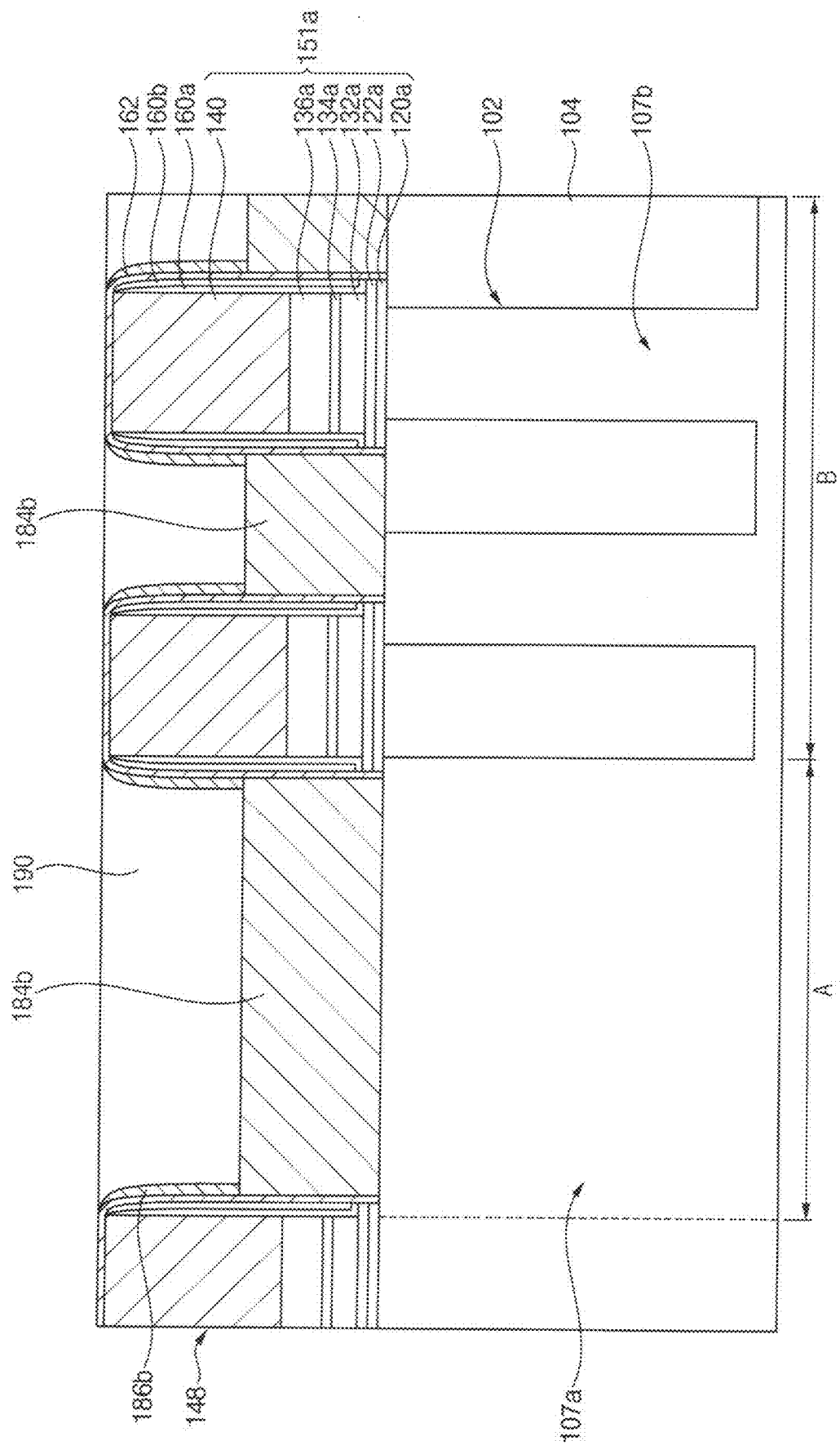

Referring to FIGS. 32 and 33, the upper insulation pattern 190 may be formed to fill the third trench 154 and the fourth trench 156 of the overlay region III and the third opening 188 of the semiconductor chip region I. The upper insulation pattern 190 may include silicon oxide.

A capacitor 196 may be formed on an upper surface of the upper contact plug 186*a*.

For example, an etch stop layer and a mold layer may be sequentially formed on the upper contact plug 186*a* and the upper insulation pattern 190. The etch stop layer and the mold layer may be partially etched to form a fourth opening exposing the upper surface of the upper contact plug 186*a*.

A lower electrode layer may be formed on a sidewall of the fourth opening, the upper surface of the upper contact plug 186*a*, and the mold layer, and a second sacrificial layer may be formed on the lower electrode layer to sufficiently fill a remaining portion of the fourth opening. Then, upper portions of the lower electrode layer and the second sacrificial layer may be planarized until an upper surface of the mold layer may be exposed. Thus, the lower electrode layer may be separated to form a lower electrode 196*a* on the upper surface of the upper contact plug 186*a*. Remaining second sacrificial layer and the mold layer may be removed by, e.g., a wet etching process. The lower electrode 196a may have a cylindrical shape. Alternatively, the lower electrode may have a pillar shape filling the fourth opening.

Thereafter, a dielectric layer 196b may be formed on a surface of the lower electrode 196a and the etch stop layer, and an upper electrode 196c may be formed on the dielectric layer 196b. Thus, the capacitor 196 including a lower electrode 196a, a dielectric layer 196b, and an upper electrode 196c may be formed.

In some example embodiments, the second overlay key may be used in the process for forming the capacitor 196. For example, the second overlay key may be used as an overlay key in the process of forming the fourth opening.

Thereafter, although not shown, an insulating interlayer covering the capacitor 196 and upper wirings may be further formed to form semiconductor chips on the semiconductor chip regions I of the substrate 100.

The semiconductor device manufactured by the above method may have the following structural features. The structural features of the semiconductor device have been mostly described in the above method. Therefore, repetitive descriptions are omitted and only important parts may be described herein.

The semiconductor device may be formed on the substrate 100, and the substrate 100 may include the semiconductor chip region I in which the semiconductor chip is formed and the scribe lane region II between the semiconductor chip region I. A region in which an overlay key is formed in the scribe region II is referred to as the overlay region III.

The overlay region III may include the second region B in which key structures serving as an actual overlay key are formed and the first region A surrounding the second region B. The first region A may correspond to an edge region of the overlay region III, and the second region B may correspond to a central region of the overlay region III. The first region A may have a first width from an end of the overlay region III to an inside of the overlay region III, and may have a rectangular ring shape in plan view. In some example embodiments, the first width may be in a range of about 1 μm to about 10 μm.

Referring to FIGS. 32 and 33, the first active pattern 106 may be formed in the semiconductor chip region I of the substrate 100, and the second active pattern 107a may be formed in the first region A of the overlay region III of the substrate 100. The third active pattern 107b may be formed in the second region B of the overlay region III of the substrate 100. The isolation pattern 104 may be formed between the first to third active patterns 106, 107a and 107b.

The first active pattern 106 may extend in the third direction. A plurality of first active patterns may be spaced apart from each other in the first and second directions.

The second active pattern 107a may be formed on the entire first region A of the substrate 100. That is, the isolation pattern 104 may not be formed on the first region A of the substrate 100.

The third active pattern 107b may have a line shape. A plurality of third active patterns 107b may be spaced apart from each other. In some example embodiments, the third active pattern 107b may extend in the fourth direction. In some example embodiments, although not shown, the third active pattern 107b may extend in the first direction, or may extend in the second direction.

A width of the second active pattern 107a in the first region A may be greater than each of a width of the third active pattern 107b and a width of the isolation pattern between the third active patterns 107b in the second region B.

The width of the third active pattern 107b and the width of the isolation pattern between the third active patterns 107b in the second region B may be greater than a width of the first active pattern 106 and a width of the isolation pattern between the first active patterns 106 in the semiconductor chip region I, respectively.

The semiconductor device may include the first gate structures 115 each of which may be buried at an upper portion of the semiconductor chip region I of the substrate 100, the bit line structures 150 on the semiconductor chip region I of the substrate 100, the storage node contacts 184a and 186a on the respective first active patterns 106 between the bit line structures 150, and the capacitors 196 on the respective storage node contacts 184a and 186a. In this case, each of the storage node contacts 184a and 186a may include stacked the lower contact plug 184a and the upper contact plug 186a. A width between the bit line structures 150 may be a second width.

The semiconductor device may include the key structures 151a having the same stacked structure as the bit line structures 150 on the overlay region III of the substrate 100. The third and fourth trenches 154 and 156 may be formed between the key structures 151a.

The third trench 154 may be formed in the first region A of the overlay region III of the substrate 100. The key structure may not be disposed in the first region A of the overlay region III of the substrate 100. The third trench 154 may face an upper surface of the second active pattern 107a. A bottom of the third trench 154 may expose the upper surface of the second active pattern 107a.

The key structures 151a may be disposed in the second region B of the overlay region III of the substrate 100. The fourth trench 156 may be formed between the key structures 151a. A bottom of the fourth trench 156 may face the third active pattern 107b and the isolation pattern 104. The bottom of the fourth trench 156 may expose upper surfaces of the third active pattern 107b and the isolation pattern 104.

The third trench 154 may have a third width, and the third width may be the same as or similar to a width of the second active pattern 107a. For example, the third width may be in a range of about 1 μm to about 10 μm. The fourth trench 156 may have a fourth width. The third width and the fourth width may be greater than the second width. The third width may be greater than the fourth width. The third width may be greater than about 1.5 times the fourth width. For example, the third width may be about 1.5 times to about 5 times the fourth width. The fourth width may be greater than about 30 times the second width. For example, the fourth width may be about 30 times to about 100 times the second width.

In some example embodiments, an upper surface of the key structure 151a may be substantially coplanar with an upper surface of the bit line structure 150. A height of an upper surface of the key structure 151a may be substantially the same as a height of the upper surface of the bit line structure 150.

A filling pattern 184b may fill lower portions of the third trench 154 and the fourth trench 156. A bottom of the filling pattern 184b in the third trench 154 may directly contact the second active pattern 107a. A bottom of the filling pattern 184b in the fourth trench 156 may directly contact the third active pattern 107b and the isolation pattern 104. The second and third active patterns 107a and 107b may not be exposed by the third and fourth trench due to the filling pattern 184b.

The filling pattern 184b may include substantially the same material as the lower contact plug 184a. In some example embodiments, the filling pattern 184b may include, e.g., polysilicon doped with impurities.

The conductive spacer 186b may be formed on upper sidewalls of the third and fourth trenches 154 and 156. The conductive spacers 186b may be formed only on upper sidewalls of the third and fourth trenches 154 and 156 that are higher than the upper surface of the filling pattern 184b. A bottom of the conductive spacer 186b may contact the upper surface of the filling pattern 184b. The conductive spacer 186b may include the same material as the upper contact plug 186a. In some example embodiments, the conductive spacer may include a metal, such as tungsten.

In some example embodiments, an insulation spacer may be further included on sidewalls of each of the key structures 151a. The insulation spacer may include a plurality of insulation spacers. The insulation spacers may be sequentially stacked on a sidewall of the key structure in a horizontal direction.

In the overlay region, the key structure 151a and the fourth trench 156 on the third active pattern 107b may serve as an overlay key. A portion of the fourth trench 156 that is higher than the upper surface of the filling pattern 184b may serve as an actual trench of the overlay key.

As described above, in the overlay region of the semiconductor device, the isolation pattern may not be formed on the first region A of the substrate 100, and the second active pattern 107a may be formed on an entire of the first region A of the substrate 100. Accordingly, a dishing defect due to a process for forming the isolation pattern 104 in the first region may not occur. Since the filling pattern 184b is formed in the third and fourth trenches 154 and 156, damages of the second and third active patterns 107a and 107b may be decreased.

Figure 34:
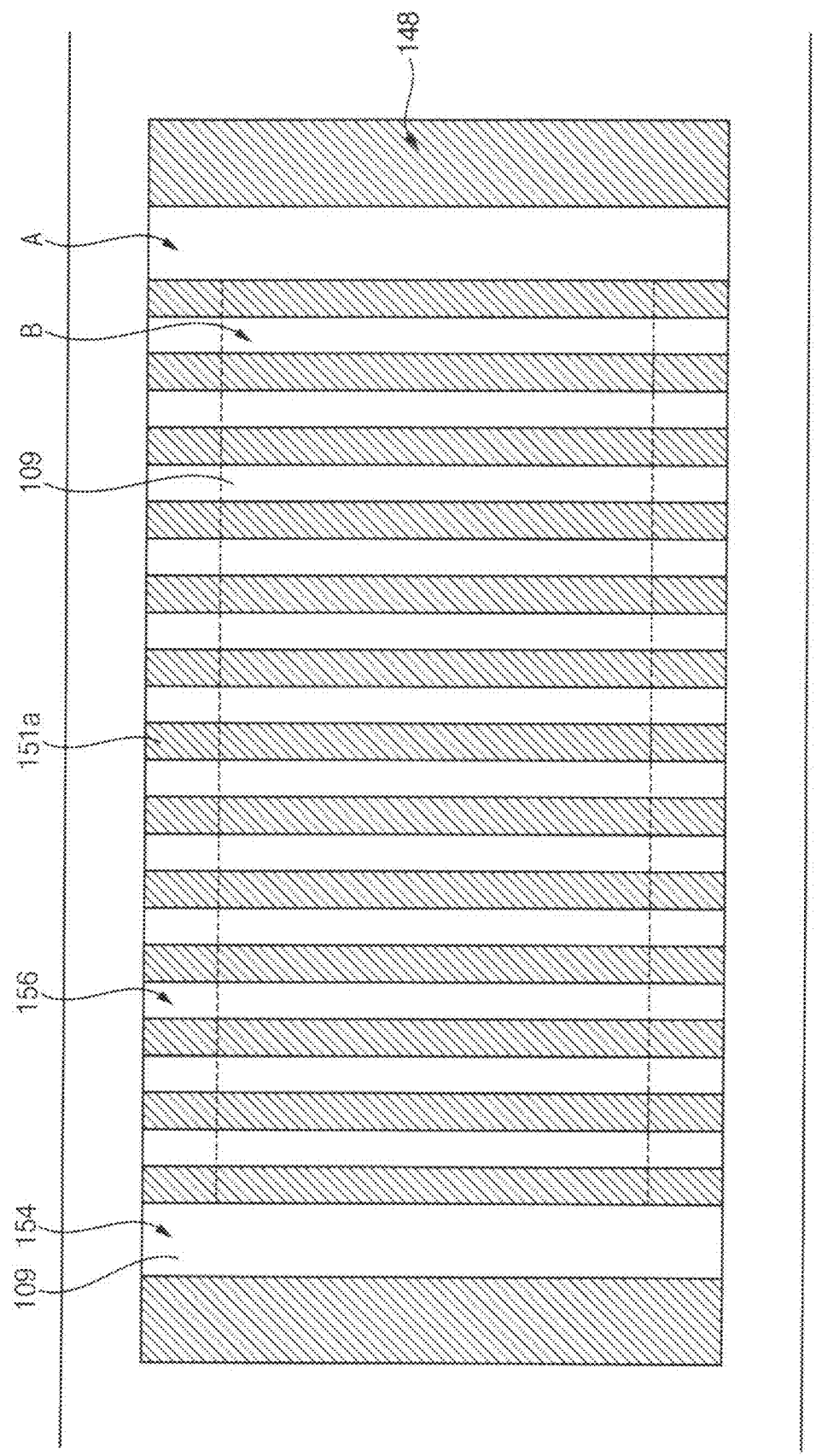
Figure 35:
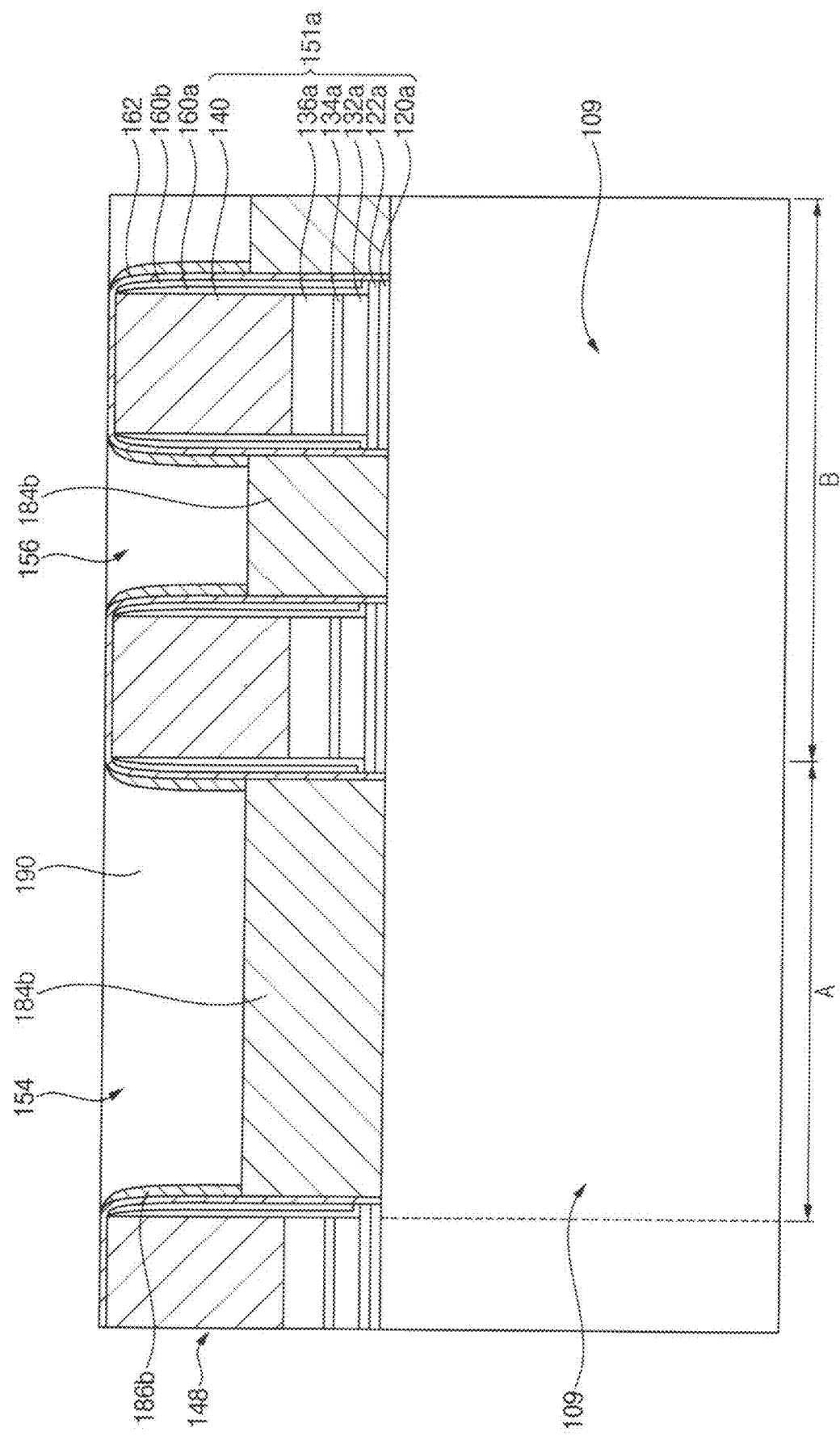

FIGS. 34 and 35 are a plan view and a cross-sectional view of semiconductor devices device in accordance with some example embodiments.

The semiconductor device shown in FIGS. 34 and 35 may be substantially the same as the semiconductor device described with reference to FIGS. 32 and 34, except that isolation patterns may not formed in the first region and the second region of the overlay region of the substrate. FIG. 34 is a plan view illustrating an overlay region before forming the filling pattern. In the semiconductor device, a structure formed in the semiconductor chip region may be substantially the same as that described with reference to FIG. 32.

Referring to FIGS. 32, 34 and 35, the first active pattern 106 may be formed in the semiconductor chip region I of the substrate 100, and a second active pattern 109 may be formed in the first region A and the second region B of the overlay region III of the substrate. The isolation pattern 104 may be formed between the first active patterns 106. Only the second active pattern 109 may be formed in the overlay region, and the isolation pattern may not be formed in the overlay region.

The semiconductor device may include the key structures 151a having the same stacked structure as the bit line structures 150 on the overlay region III of the substrate 100. The third and fourth trenches may be formed between the key structures 151a.

The third trench 154 may be formed in the first region A of the overlay region III of the substrate 100.

The key structures 151a may be disposed in the second region B of the overlay region III of the substrate 100. The fourth trench 156 may be formed between the key structures 151a.

The third and fourth trenches 154 and 156 may face an upper surface of the second active pattern 109. A bottom of each of the third and fourth trenches 154 and 156 may expose an upper surface of the second active pattern 109.

The filling pattern 184b may fill lower portions of the third trench 154 and the fourth trench 156. A bottom of the filling pattern 184b in the third and fourth trenches 154 and 156 may contact the second active pattern 109. The second active pattern 109 may not be exposed by the third and fourth trenches 154 and 156 due to the filling pattern 184b.

In the overlay region, the key structure 151a and the fourth trench 156 on the second active pattern 109 may serve as an overlay key. A portion of the fourth trench 156 that is higher than an upper surface of the filling pattern 184b may serve as an actual trench of the overlay key.

As described above, the isolation pattern may not be formed on the first and second regions A and B of the overlay region of the substrate 100, and the second active pattern 109 may be formed on entire of the first and second regions A and B of the overlay region of the substrate 100. Thus, a dishing defect due to a process for forming the isolation pattern in the first region A may not occur. Since the filling pattern 184b is formed in the third and fourth trenches 154 and 156, damages of the second active pattern 109 may be decreased.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of embodiments of inventive concepts. Accordingly, all such modifications are intended to be included within the scope of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a substrate including a semiconductor chip region and an overlay region,
   the substrate including a first region at an edge portion of the overlay region and a second region at a central portion of the overlay region;
   a patterned structure on the substrate,
   the patterned structure including bit line structures on the semiconductor chip region of the substrate, the bit line structures being spaced apart from each other by a first distance,
   the patterned structure defining a first trench on the first region and a second trench on the second region,
   the patterned structure including key structures on the second region and spaced apart from each other by the second trench;
   a filling pattern on the first region and the second region, the filling pattern filling a lower portion of the first trench on the first region and a lower portion of the second trench on the second region; and
   a conductive spacer contacting a portion of an upper surface of the filling pattern, the conductive spacer on an upper sidewall of the first trench and an upper sidewall of the second trench, and the conductive spacer not extending between the key structures, wherein the first region includes a first active pattern, and no isolation pattern is disposed on the first region.

2. The semiconductor device of claim 1, wherein each of the key structures has a same stacked structure as each of the bit line structures.

3. The semiconductor device of claim 1, wherein an upper surface of each of the key structures is level with an upper surface of each of the bit line structures.

4. The semiconductor device of claim 1, wherein the first distance is less than a width of the first trench and the first distance is less than a width of the second trench.

5. The semiconductor device of claim 1, wherein a width of the first trench is greater than a width of the second trench.

6. The semiconductor device of claim 1, wherein the filling pattern of the first region directly contacts an upper surface of the first active pattern.

7. The semiconductor device of claim 1, further comprising:
an isolation pattern on the second region, wherein
the second region includes a second active pattern,
portions of the second active pattern have a line shape, and
the portions of the second active pattern and the isolation pattern are alternately and repeatedly disposed on the second region of the overlay region of the substrate.

8. The semiconductor device of claim 7, wherein the filling pattern of the second region directly contacts an upper surface of the second active pattern and an upper surface of the isolation pattern.

9. The semiconductor device of claim 1, further comprising:
a storage node contact between the bit line structures, wherein
the storage node contact includes a lower contact plug and an upper contact plug sequentially stacked.

10. The semiconductor device of claim 9, wherein the lower contact plug includes a same material as the filling pattern.

11. The semiconductor device of claim 10, wherein the filling pattern includes polysilicon doped with impurities.

12. The semiconductor device of claim 9, wherein the upper contact plug includes a same material as the conductive spacer.

13. The semiconductor device of claim 12, wherein the upper contact plug includes a metal.

14. A semiconductor device, comprising:
a substrate including a semiconductor chip region and an overlay region,
the substrate including a first region at an edge portion of the overlay region and a second region at a central portion of the overlay region, and
the first region including a first active pattern;
a gate structure buried in an upper portion of the semiconductor chip region of the substrate;
a patterned structure on the substrate,
the patterned structure including bit line structures on the semiconductor chip region of the substrate, the bit line structures being spaced apart from each other by a first distance,
the patterned structure defining a first trench on the first region and a second trench on the second region,
the first trench exposing the first active pattern on the first region of the substrate,
the patterned structure including key structures on the second region, the key structures being spaced apart from each other by the second trench;
a storage node contact on the substrate between the bit line structures;
a capacitor on the storage node contact;
a filling pattern filling a lower portion of each of the first trench and the second trench; and
a conductive spacer contacting a portion of an upper surface of the filling pattern, the conductive spacer on an upper sidewall of each of the first trench and the second trench, and the conductive spacer not extending between the key structures,
wherein no isolation pattern is disposed on the first region.

15. The semiconductor device of claim 14, wherein the filling pattern is on the first region and directly contacts an upper surface of the first active pattern.

16. The semiconductor device of claim 14, wherein a second active pattern and an isolation pattern are alternately and repeatedly disposed on the second region of the overlay region of the substrate, and the second active pattern has a line shape.

17. The semiconductor device of claim 16, further comprising:
an isolation pattern on the substrate in the second region, wherein
the filling pattern is on the second region and directly contacts an upper surface of each of the second active pattern and the isolation pattern.

18. A semiconductor device, comprising:
a substrate including an overlay region,
the substrate including a first region at an edge region of the overlay region and a second region at a center region of the overlay region, and
the first region including a first active pattern;
a patterned structure on the substrate,
the patterned structure defining a first trench on the first region and a second trench on the second region,
the first trench exposing the first active pattern, and
the patterned structure including key structures on the second region, the key structures being spaced apart from each other by the second trench;
a filling pattern filling a lower portion of each of the first trench and the second trench; and
a conductive spacer contacting a portion of an upper surface of the filling pattern, the conductive spacer on an upper sidewall of each of the first trench and the second trench, and the conductive spacer not extending between the key structures,
wherein no isolation pattern is disposed on the first region.

19. The semiconductor device of claim 18, wherein
a width of the first trench is greater than a width of the second trench, and the filling pattern is on the first region and directly contacts an upper surface of the first active pattern.

* * * * *